(12) United States Patent
Rhee et al.

(10) Patent No.: US 7,659,130 B2
(45) Date of Patent: Feb. 9, 2010

(54) THIN FILM TRANSISTOR ARRAY PANEL FOR DISPLAY AND MANUFACTURING METHOD THEREOF

(75) Inventors: Young-Joon Rhee, Seoul (KR); Jong-Soo Yoon, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/486,274

(22) Filed: Jul. 12, 2006

(65) Prior Publication Data

US 2006/0252168 A1 Nov. 9, 2006

Related U.S. Application Data

(62) Division of application No. 10/328,832, filed on Dec. 23, 2002, now Pat. No. 7,102,168.

(30) Foreign Application Priority Data

Dec. 24, 2001 (KR) ........................ 2001-0084420
Dec. 23, 2002 (KR) ........................ 2002-0082410

(51) Int. Cl.
*H01L 21/00* (2006.01)
(52) U.S. Cl. .................. 438/38; 438/29; 438/151; 257/E29.273; 257/E21.411
(58) Field of Classification Search ............ 438/69, 438/70, 128, 149, 151, 197, 199, FOR. 184, 438/FOR. 183, FOR. 201, 29, 30, 34, 36, 438/38, FOR. 157; 257/72, E29.273, E27.111, 257/E21.411; 439/42, 43, 97, 106
See application file for complete search history.

(56) References Cited

U.S. PATENT DOCUMENTS

| | | | | |
|---|---|---|---|---|
| 5,883,682 A | * | 3/1999 | Kim et al. | 349/43 |
| 5,994,721 A | * | 11/1999 | Zhong et al. | 257/89 |
| 6,191,835 B1 | | 2/2001 | Choi | |
| 6,338,989 B1 | | 1/2002 | Ahn et al. | |
| 6,717,638 B1 | * | 4/2004 | Kim | 349/106 |
| 6,759,281 B1 | * | 7/2004 | Kim et al. | 438/149 |
| 7,542,112 B2 | * | 6/2009 | Rhee et al. | 349/109 |
| 2001/0025958 A1 | * | 10/2001 | Yamazaki et al. | 257/72 |
| 2002/0127887 A1 | * | 9/2002 | Uehara et al. | 438/800 |

FOREIGN PATENT DOCUMENTS

KR 10-2000-0048021 A 7/2000

* cited by examiner

*Primary Examiner*—Matthew Smith
*Assistant Examiner*—Quovaunda Jefferson
(74) *Attorney, Agent, or Firm*—Innovation Counsel LLP

(57) ABSTRACT

A gate conductor including a gate line, a gate pad and a gate electrode is formed on a substrate. A gate insulating layer, a semiconductor layer, a doped amorphous silicon layer and a conductive layer are deposited in sequence, and then a photoresist film pattern is formed thereon. The photoresist film pattern includes a first portion positioned between the to be formed source electrode and drain electrode, a second portion thicker than the first portion, and the third portion with no photoresist. A data conductor including a data line, a data pad, a source electrode, a drain electrode and a conductor pattern for a storage capacitor, an ohmic contact layer pattern and a semiconductor pattern are formed by etching the conductive layer, the doped amorphous silicon layer and the semiconductor layer using the photoresist film pattern. A plurality of color filters of red, green and blue having apertures exposing part of the drain electrode are formed thereon. A passivation layer made of acryl-based organic material having excellent planarization characteristic is formed thereon. A pixel electrode, an auxiliary gate pad and an auxiliary data pad connected to the drain electrode, the gate pad and the data pad via contact holes, respectively, are formed on the passivation layer. The contact hole exposing the drain electrode is located within the aperture.

5 Claims, 35 Drawing Sheets

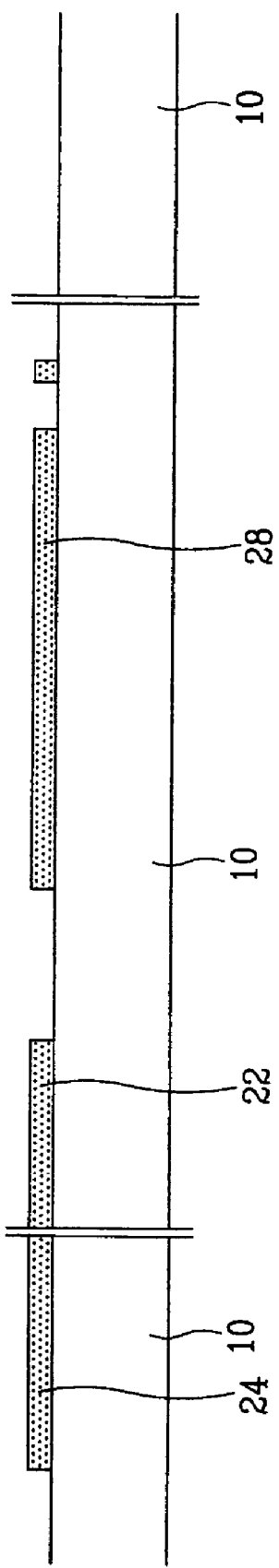

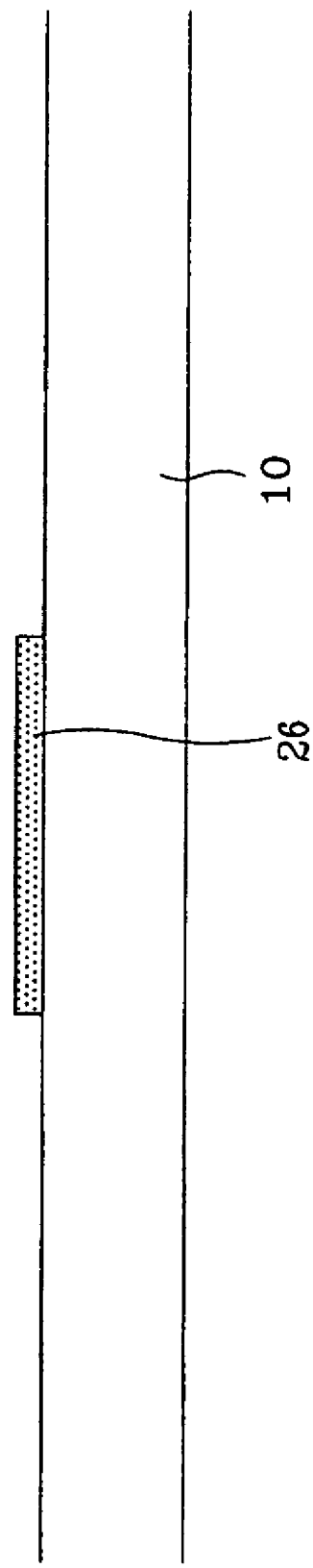

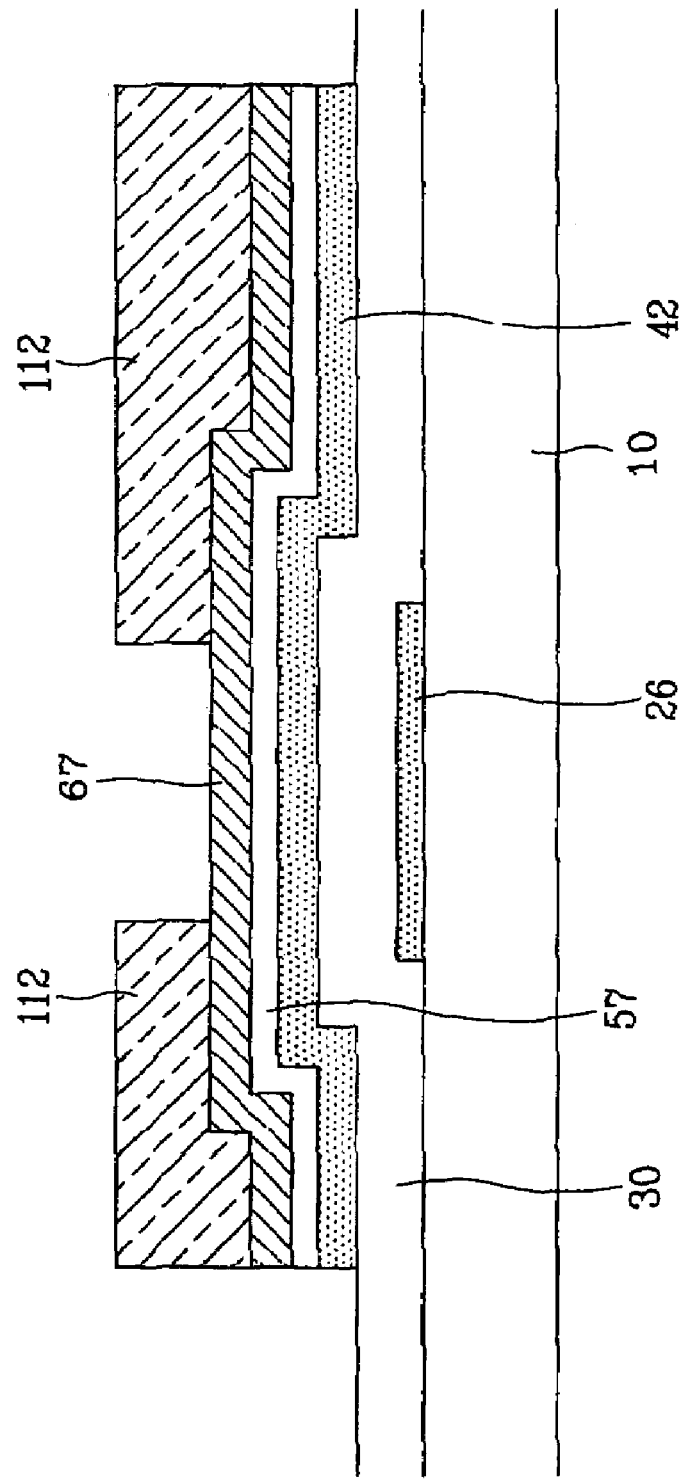

THIN FILM TRANSISTOR ARRAY PANEL FOR DISPLAY AND MANUFACTURING METHOD THEREOF

CROSS-REFERENCE TO RELATED APPLICATIONS

This application is a divisional of U.S. application Ser. No. 10/328,832, filed on Dec. 23, 2002, now U.S. Pat. No. 7,102,168 entitled "Thin Film Transistor Array Panel for Display and Manufacturing Method Thereof," the disclosure of which is incorporated by reference herein in its entirety. This application also claims the benefit of priority of Korean patent application no. 2002-0082410, filed Dec. 23, 2002, and Korean patent application no. 2001-0084420, filed Dec. 24, 2001.

FIELD OF THE INVENTION

The present invention relates to a manufacturing method for a thin film transistor array panel for a display.

DESCRIPTION OF THE RELATED ART

A liquid crystal display ("LCD") is one of the most widely used flat panel displays. The LCD, which includes two panels with respective electrodes and a liquid crystal layer with dielectric anisotropy disposed therebetween, displays desired images by applying an electric field to the liquid crystal layer to control the amount of light passing through the panels.

The most frequently used type of LCD are those having a plurality of electrodes formed on two panels along with a plurality of thin film transistors ("TFTs") which receive switching voltages applied to the electrodes. One of the two panels has a plurality of signal lines, such as gate lines and data lines, a plurality of pixel electrodes and the TFTs controlling image signals to be transmitted to the pixel electrodes. The other panel has a common electrode opposite to the pixel electrodes and an array of color filters of red (R), green (G) and blue (B).

The respective panels are normally manufactured by a photo etching process using masks. The panel with the TFTs is generally manufactured by using five or six masks and the other panel with the color filters is manufactured by using three or four masks.

In this manufacturing method of the LCD, it is preferable to decrease the number of masks so as to reduce production cost, and to simplify the manufacturing process.

In addition, it is desirable to produce panels with a high aperture ratio to increase the brightness of the LCD. To achieve the foregoing, a method is utilized which forms the color filters on the same panel together with the TFTs to minimize a process margin between the two panels for increasing the aperture ratio. An organic insulating layer having excellent planarization characteristics is formed on the color filters to improve the profile of other layers formed thereafter.

In this manufacturing method of an LCD, contact holes for connecting drain electrodes of the TFTs to the pixel electrodes are formed in the color filters and the organic insulating layer. Since the color filters and the organic insulating layer are all organic layers and are very thick, it is hard to obtain good profiles of contact holes during an etching process. An additional photo etching process may solve the problem, but this increases the complexity of the process

SUMMARY OF THE INVENTION

A TFT panel for an LCD and a manufacturing method thereof capable of simplifying a manufacturing process are provided.

In accordance with the present invention, an aperture exposing a drain electrode is formed at the time of forming a color filter, and a contact hole is provided in a passivation layer to expose the drain electrode located within the aperture.

A method according to an embodiment of the present invention includes forming a gate conductor including a gate line and a gate electrode portion of the gate line on an insulating substrate. A gate insulating layer covering the gate conductor, a semiconductor pattern on the gate insulating layer, and a data line including a source electrode, and a drain electrode separated from the source electrode are formed. A color filter covering the data line is formed using photoresist material including pigment. A first aperture is provided in the color filter exposing the drain electrode. A passivation layer covering the color filter is deposited and patterned to form a contact hole exposing the drain electrode, with the contact hole being located within the aperture. A pixel electrode connected to the drain electrode via the contact hole is formed on the passivation layer.

An insulating layer of SiNx may be formed before forming the color filters. It is preferable that the passivation layer is made of organic material or a low dielectric insulating material having a dielectric constant equal to or less than 4.0 formed by a chemical vapor deposition.

The separation of the source electrode and the drain electrode is achieved by a photo etching process using a photoresist film pattern, wherein the photoresist film pattern preferably includes a first portion positioned between the source electrode and the drain electrode, the first portion having a first thickness, a second portion thicker than the first portion and a third portion thinner than the first portion and the second portion.

A thin film transistor array panel for a display according to an embodiment of the present invention includes: a gate conductor formed on an insulating substrate and including a gate line and a gate electrode; a gate insulating layer covering the gate conductor; a semiconductor pattern formed on the gate insulating layer; a data conductor formed at least on the semiconductor pattern, the data conductor including a data line having a source electrode, a drain electrode separated from the source electrode; a color filter having a first aperture exposing at least a portion of the drain electrode and made of photoresist material including pigment; a passivation layer covering the color filter and having a first contact hole exposing at least a portion of the drain electrode, the first contact hole being located within the first aperture; and a pixel electrode formed on the passivation layer and connected to the drain electrode via the first contact hole.

The semiconductor pattern except for a channel portion between the source electrode and the drain electrode may have the same shape as the data conductor.

BRIEF DESCRIPTION OF THE DRAWINGS

The above and other advantages of the present invention will become more apparent by the following description in connection with the accompanying drawings in which:

FIGS. 11B and 11C are sectional views taken along the lines XIB-XIB' and XIC-XIC' in FIG. 11A, respectively;

FIGS. 14A, 15A and 16A and FIGS. 14B, 15B and 16B are sectional views taken along the lines XIIIB-XIIIB' and XIIIC-XIIIC' in FIG. 13A, respectively, which show the next steps following FIGS. 13B and 13C, respectively;

DETAILED DESCRIPTION OF THE EMBODIMENTS

Figure 1:
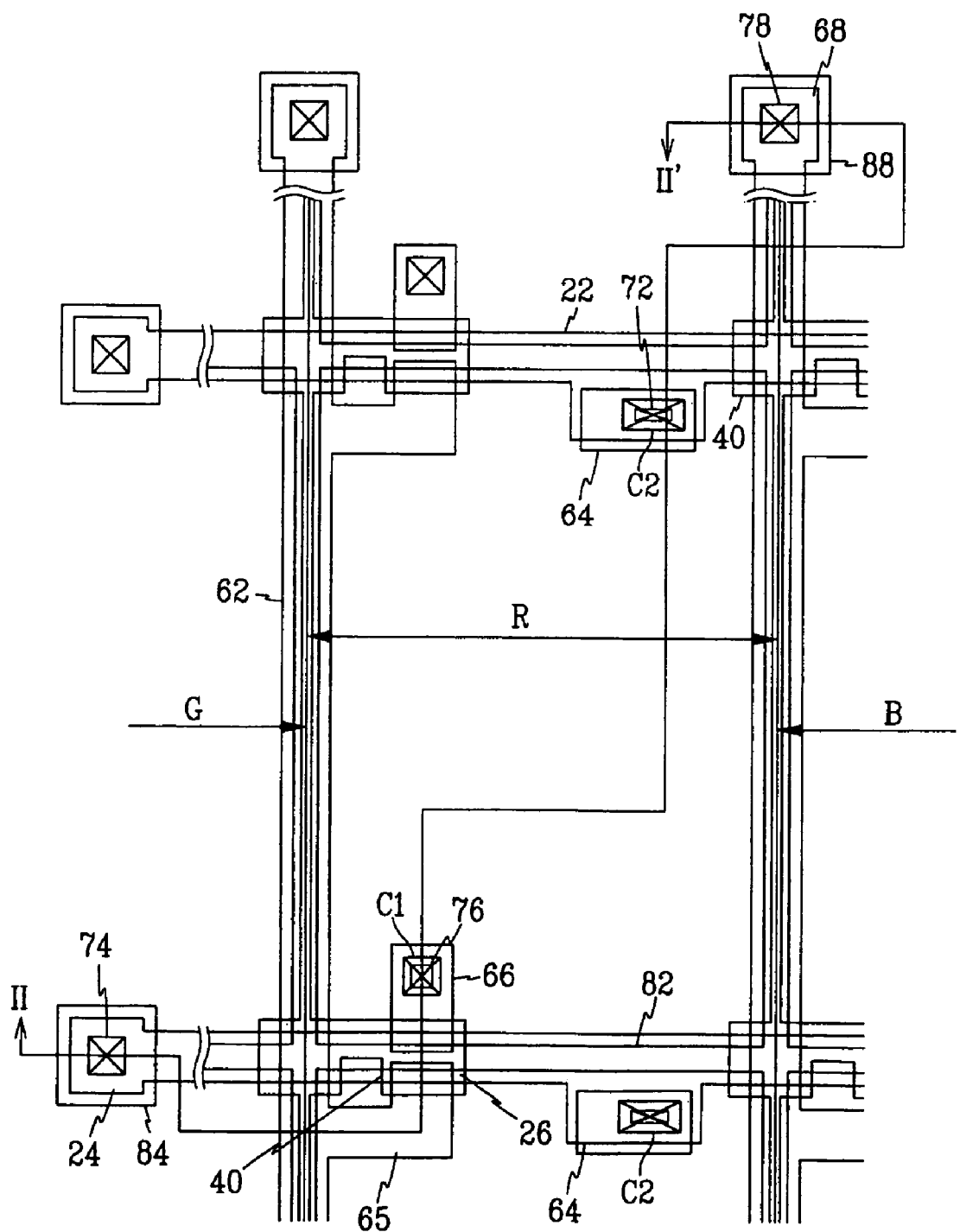
FIG. 1 is a layout view of a TFT array panel for an LCD according to a first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, film, region, substrate or panel is referred to as being "on" another element, it can be directly on the other element or intervening elements may also be present. In contrast, when an element is referred to as being "directly on" another element, there are no intervening elements present. Then, liquid crystal displays according to embodiments of the present invention will be described with reference to the drawings.

Figure 2:
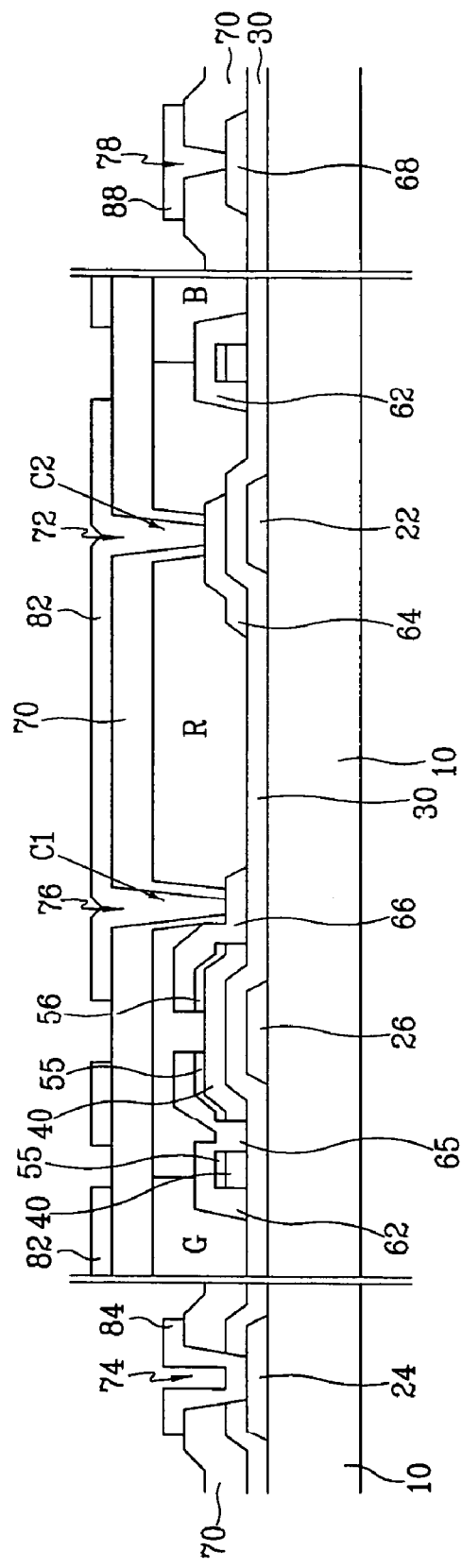
FIG. 2 is a sectional view of the TFT array panel taken along the line II-II' in FIG. 1.

Referring to FIGS. 1 and 2, a TFT array panel for an LCD according to an embodiment of the present invention will be described in detail.

FIG. 1 is a layout view of an exemplary TFT array panel for an LCD according to an embodiment of the present invention, and FIG. 2 is a sectional view of the TFT array panel shown in FIG. 1 taken along the line II-II'.

A plurality of gate lines 22 extending substantially in a transverse direction are formed on an insulating substrate 10. The gate lines 22 include either a single layer preferably made of material with low resistivity such as Ag, Ag alloy, Al and Al alloy, or multiple layers including such a single layer and a layer made of material with good physical and electrical contact characteristics such as Mo, Cr, Ti and Ta. Each gate line 22 has a plurality of expansions, and a plurality of branches of each gate line 22 form gate electrodes 26 of TFTs. The lateral sides of the gate lines 22 are tapered, and the inclination angle of the lateral sides with respect to a horizontal surface ranges 30-80 degrees.

According to another embodiment of the present invention, a plurality of storage electrodes (not shown) for storage capacitors enhancing the electrical charge storing capacity are also formed on the substrate 10. The storage electrodes are applied with a predetermined voltage such as a common electrode voltage (referred to as "a common voltage" hereinafter) from an external source. The common voltage is also applied to a common electrode (not shown) of the other panel (not shown).

A gate insulating layer 30 preferably made of $SiN_x$ is formed on the gate lines 22 and the storage electrodes.

A plurality of semiconductor stripes 40 preferably made of hydrogenated amorphous silicon are formed on the gate insulating layer 30, and a plurality of branches of each semiconductor stripe 40 extend onto a plurality of gate electrodes 26 to form channels of TFTs. A plurality of sets of ohmic contact stripes and islands 55 and 56 preferably made of silicide or n+ hydrogenated amorphous silicon heavily doped with n type impurity are formed on the semiconductor stripes 40. Each of the ohmic contact islands 56 is separated from and opposite the ohmic contact stripes 55 with respect to a corresponding one of the gate electrodes 26. The lateral sides of the semiconductor stripes 40 and the ohmic contacts 55 and 56 are tapered, and the inclination angles thereof are in the range between 30-80 degrees.

A plurality of data lines 62, a plurality of drain electrodes 66 of the TFTs and a plurality of storage-capacitor conductors 64 are formed on the ohmic contacts 55 and 56 and the gate insulating layer 30. The data lines 62, the drain electrodes 66 and the storage-capacitor conductors 64 preferably include Al and Ag with low resistivity, and may further include Mo, MoW, Cr or Ta having good contact characteristic with other material.

The data lines 62 extend substantially in a longitudinal direction and intersect the gate lines 22, and a plurality of branches of each data line 62 form source electrodes 65 of the TFTs. Each pair of the source electrode 65 and the drain electrode 66 are located at least in part on the relevant ohmic contacts 55 and 56, and separated from and opposite each other with respect to the gate electrodes 26.

The storage-capacitor conductors 64 overlap the expansions of the gate lines 22.

The data lines 62, the drain electrodes 66 and the storage-capacitor conductors 64 have tapered lateral sides, and the inclination angles of the lateral sides range 30-80 degrees.

The ohmic contacts 55 and 56 interposed between the semiconductor stripes 40 and the data lines 62 and the drain electrodes 66 reduce the contact resistance therebetween.

A plurality of red, green and blue color filters indicated R, G and B in the figures are formed on the data lines 62, the drain electrodes 66, the storage-capacitor conductors 64 and portions of the semiconductor islands 40 and the gate insulating layer 30, which are not covered by the data lines 62 and the drain electrodes 66. The color filters R, G and B extend in a longitudinal direction and have a plurality of apertures C1 and C2 exposing the drain electrodes 66 and the storage-capacitor conductors 64. In this embodiment, the boundaries of the color filters R, G and B coincide and are located on the data lines 62. According to another embodiment, the color filters R, G and B overlap each other on the data lines 62 to block the light leakage. The color filters R, G and B do not exist near pad areas provided with end portions 24 and 68 of the gate lines 22 and the data lines 62.

An interlayer insulating layer (not shown) preferably made of SiOx or SiNx may be formed under the color filters R, G and B.

A passivation layer 70 is formed on the color filters R, G and B. The passivation layer 70 is preferably made of an acryl-based organic insulating material having an excellent planarization characteristic and a low dielectric constant or a low dielectric insulating material such as SiOC or SiOF formed by a chemical vapor deposition and having a low dielectric constant equal to or lower than 4.0. The passivation layer 70 has a plurality of contact holes 78, 76 and 72 exposing the data pads 68, the drain electrodes 66 and the storage-capacitor conductors 64, respectively. The passivation layer 70 and the gate insulating layer 30 have other contact holes 74 exposing the gate pads 24. The contact holes 76 and 72 exposing the drain electrodes 66 and the storage-capacitor conductors 64 respectively are positioned within the apertures C1 and C2 of the color filters R, G and B. The passivation layer 70 further has a plurality of contact holes 78 exposing data pads 68 of the data lines 62; and the passivation layer 70 and the gate insulating layer 30 has a plurality of contact holes 74 exposing gate pads 24 of the gate lines 22. The contact holes 74 and 78 are provided for electrical connection between the gate lines 22 and data lines 62 and the driving circuits therefor. When the interlayer insulating layer is added under the color filters R, G and B, as mentioned above, the contact holes 76 and 72 have the same planar shapes as those of the interlayer insulating layer.

The contact holes 72, 74, 76 and 78 of the passivation layer 70 and the apertures C1 and C2 have tapered sidewalls. The inclination angles of sidewalls of the contact holes 72, 74, 76 and 78 may be different, and the inclination angle of the upper or the inner sidewall is preferably smaller than the lower or the outer sidewall. The inclination angles with respect to a horizontal surface are preferably 30-70 degrees.

According to another embodiment, the contact holes 76 and 72 are of a larger size than the apertures C1 and C2 and contact holes 76 and 72 have vertical sidewalls.

This contact structure ensures a smooth profile of films in the contact holes 72 and 76.

A plurality of pixel electrodes 82, preferably made of transparent conductive material such as indium tin oxide ("ITO") or indium zinc oxide ("IZO"), are formed on the passivation layer 70. The pixel electrodes 82 are physically and electrically connected to the drain electrodes 66 via the contact holes 76 and connected to the storage-capacitor conductors 64 via the contact holes 72. The storage-capacitor conductors 64 and the expansions of the gate lines 22 form storage capacitors.

Each pixel electrode 82 when supplied with voltages from the data lines 62 generates an electric field in cooperation with a common electrode provided on the other panel, and the variation of the applied voltage changes the orientations of liquid crystal molecules in a liquid crystal layer between the two field-generating electrodes. In view of electrical circuits, each electrode 82 and the reference electrode form a capacitor with liquid crystal dielectric for storing electrical charges.

The electrodes 82 overlap the gate lines 22 and the data lines 62 to increase aperture ratio and to form a plurality of storage capacitors, connected parallel to the liquid crystal capacitors, for enhancing the charge storing capacity thereof.

Furthermore, a plurality of contact assistants 84 and 88 are formed on the passivation layer 70. The contact assistants 84 and 88 are connected to the exposed gate pads 24 and data pads 68 of the gate and the data lines 22 and 62, respectively, through the contact holes 74 and 78, respectively. The contact assistants 84 and 88 are optional, but are preferred to protect the exposed portions of gate pads 24 and data pads 68 of the gate and the data lines 22 and 62, respectively, and to complement the adhesiveness of the TFT array panel and the driving ICs. The contact assistants 84 and 88 are made of the same layer either as the transparent electrodes 82, or as the reflecting electrode 86.

According to another embodiment of the present invention, a plurality of metal islands (not shown) preferably made of the same material as the gate lines 22 or the data lines 62 are provided near the end portions of the gate and/or the data lines 22 and 62. The metal islands are connected to the contact assistants 84 or 88 via a plurality of contact holes provided at the gate insulating layer 30 and/or the lower insulating layer 70.

Now, a method of manufacturing a TFT array panel for an LCD according to the first embodiment of the present invention will be described in detail with reference to FIGS. 3A to 7B and FIGS. 1 and 2.

FIGS. 3A, 4A, 5A, 6A and 7A are layout views of a TFT array panel for a LCD in the respective steps of a manufacturing method thereof according to an embodiment of the present invention, and FIGS. 3B, 4B, 5B, 6B and 7B are sectional views of the TFT array panel shown in FIGS. 3A, 4A, 5A, 6A and 7A taken along the lines IIIb-IIIb', IVb-IVb', V-V', VIb-VIb' and VIIb-VIIb', respectively.

Figure 3A:
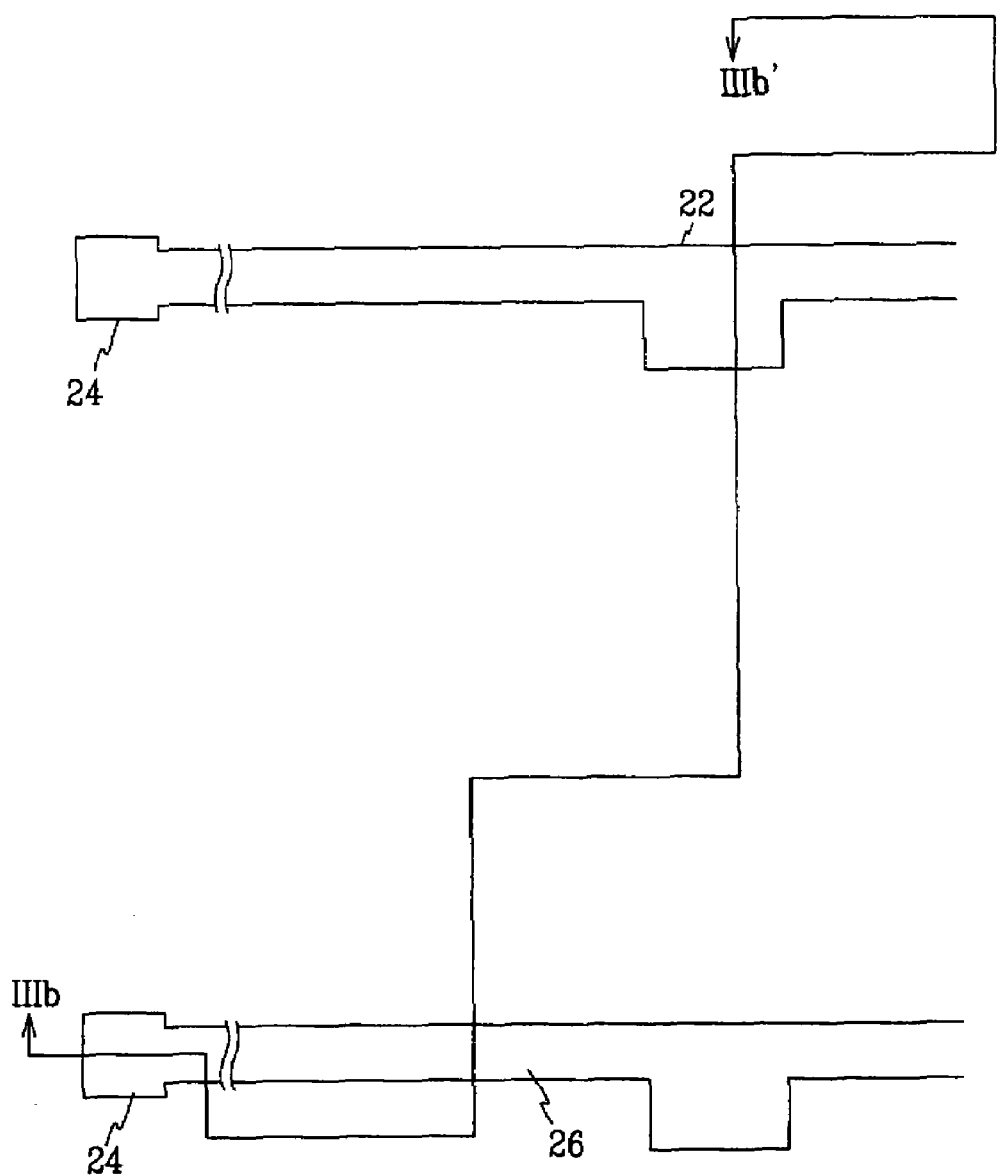
FIG. 3A is a layout view of the TFT panel in a first step of the manufacturing method according to the first embodiment of the present invention.
Figure 3B:
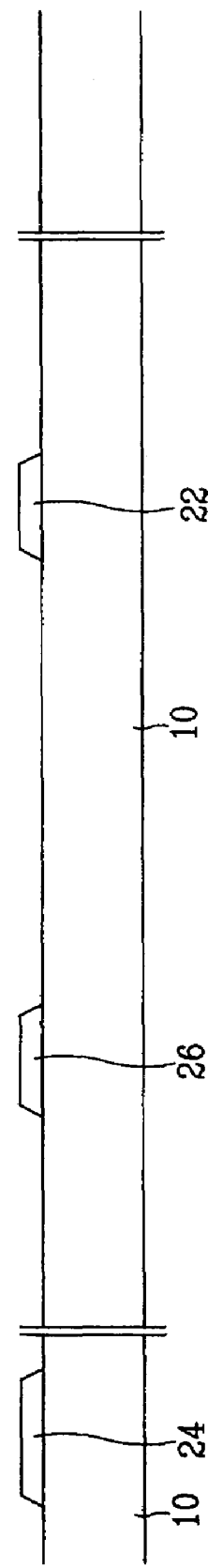
FIG. 3B is a sectional view taken along the line IIIb-IIIb' in FIG. 3A.

First, as shown in FIGS. 3A and 3B, a plurality of gate lines 22 including a plurality of gate electrodes 26 is formed on a glass substrate 10 by photo etch.

Figure 4A:
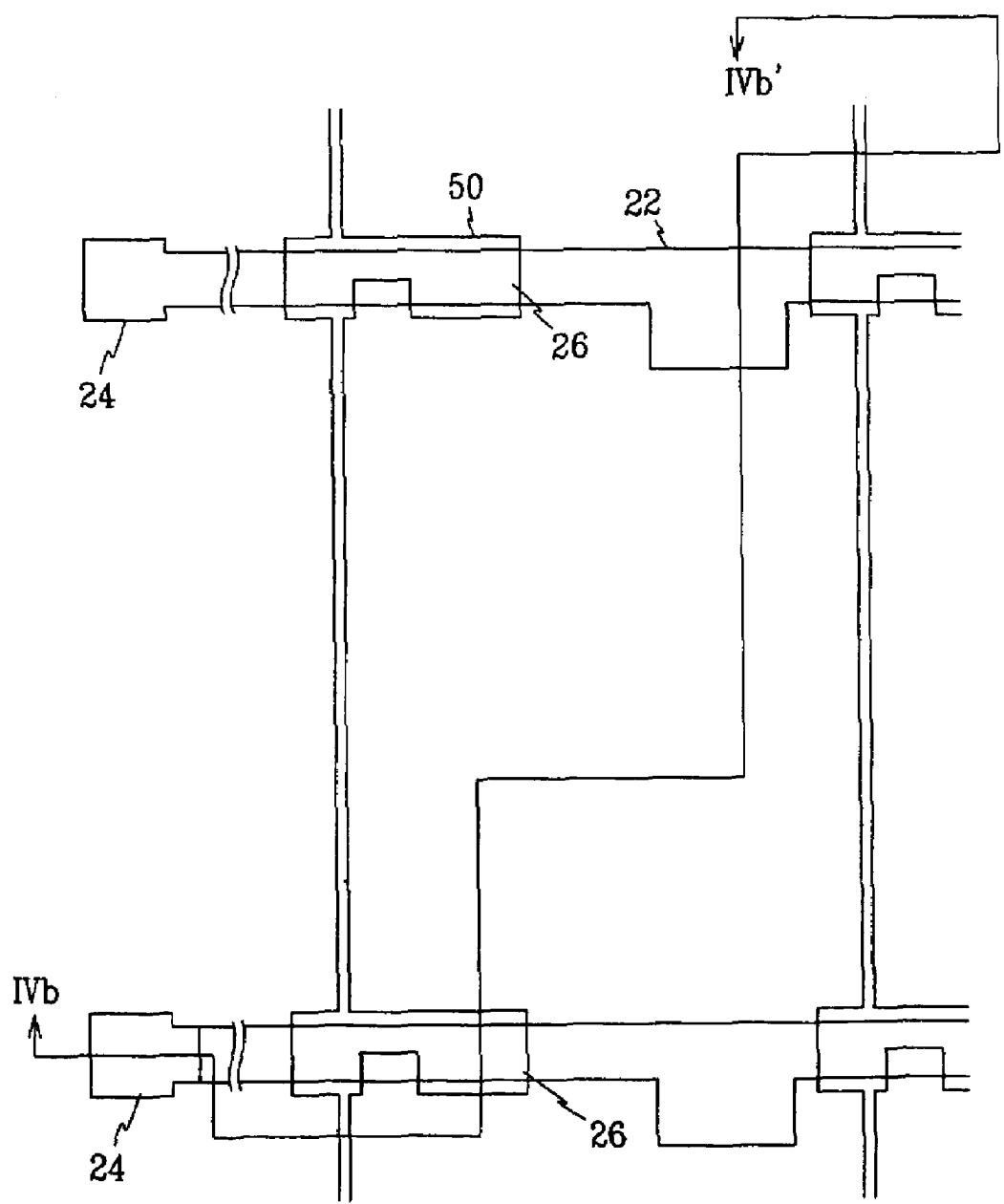
FIG. 4A is a layout view of the TFT array panel in a second step of the manufacturing method according to the first embodiment of the present invention.
Figure 4B:
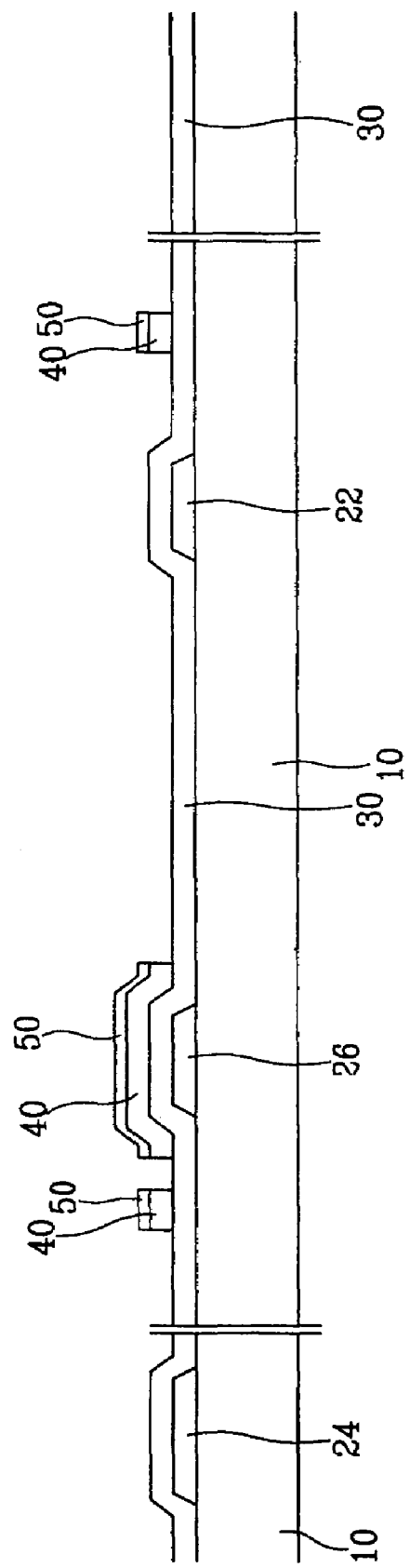
FIG. 4B is a sectional view taken along the line IVb-IVb' in FIG. 4A.

Next, as shown FIGS. 4A and 4B, after sequentially depositing a gate insulating layer 30, an amorphous silicon layer, and a doped amorphous silicon layer, the doped amorphous silicon layer and the amorphous silicon layer are photo-etched to form a plurality of semiconductor stripes 40 and a plurality of doped amorphous silicon stripes 50 on the gate insulating layer 30.

Figure 5A:
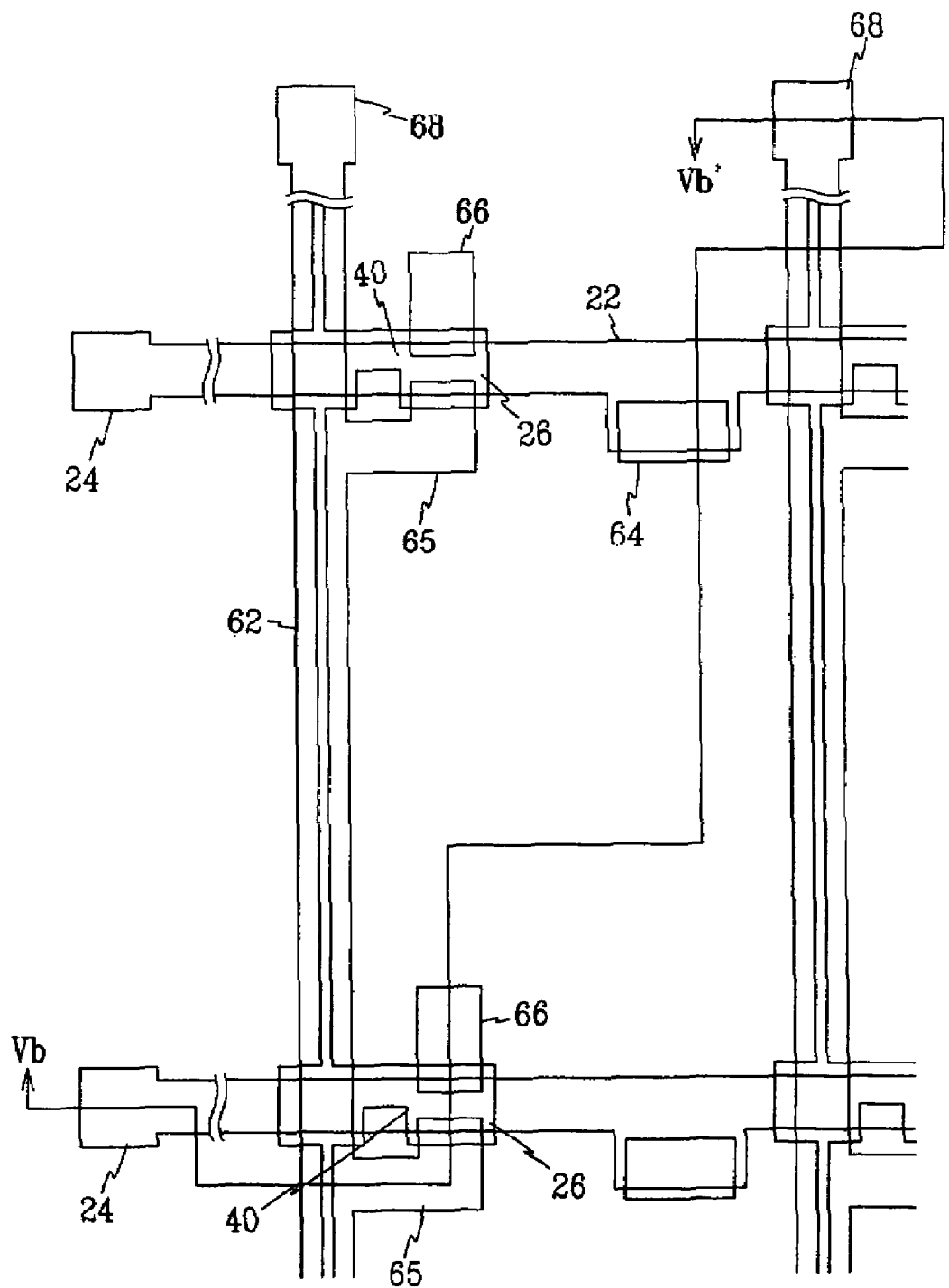
FIG. 5A is a layout view of the TFT array panel in a third step of the manufacturing method according to the first embodiment of the present invention.
Figure 5B:
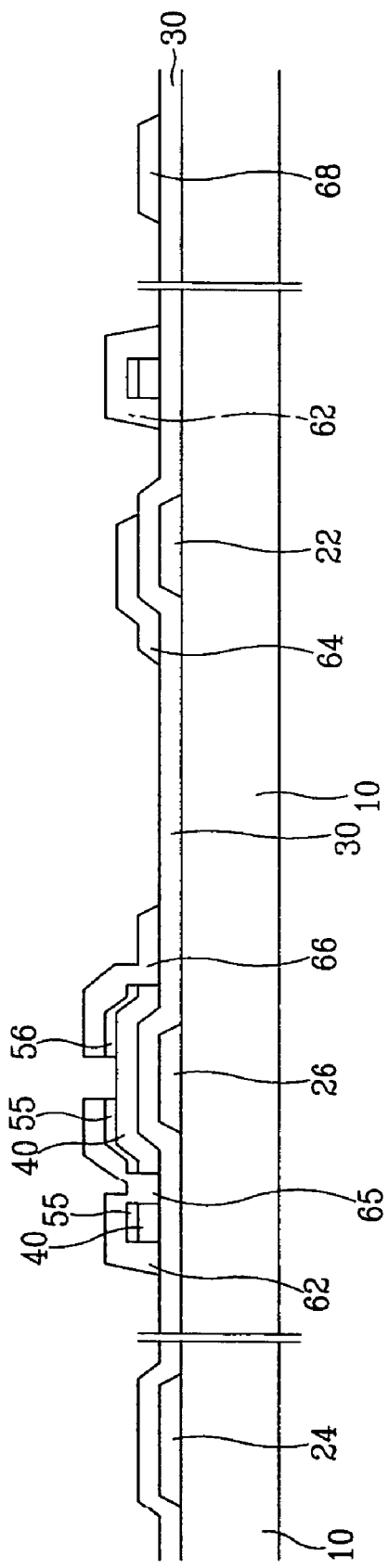
FIG. 5B is a sectional view taken along the line Vb-Vb' in FIG. 5A.

Subsequently, as shown in FIGS. 5A and 5B, a plurality of data lines 65 including a plurality of source electrodes 65, a plurality of drain electrodes 66, and a plurality of storage-capacitor conductors 64 are formed by photo etch. Thereafter, portions of the doped amorphous silicon stripes 50, which are not covered by the data lines 62 and the drain electrodes 66, are removed such that each doped amorphous silicon island 50 is separated into an ohmic contact stripe 55 and a plurality of ohmic contact islands 56 to expose a portion of the underlying semiconductor stripe 40 located therebetween. Oxygen plasma treatment is preferably performed in order to stabilize the exposed surfaces of the semiconductor stripes 40.

Figure 6A:
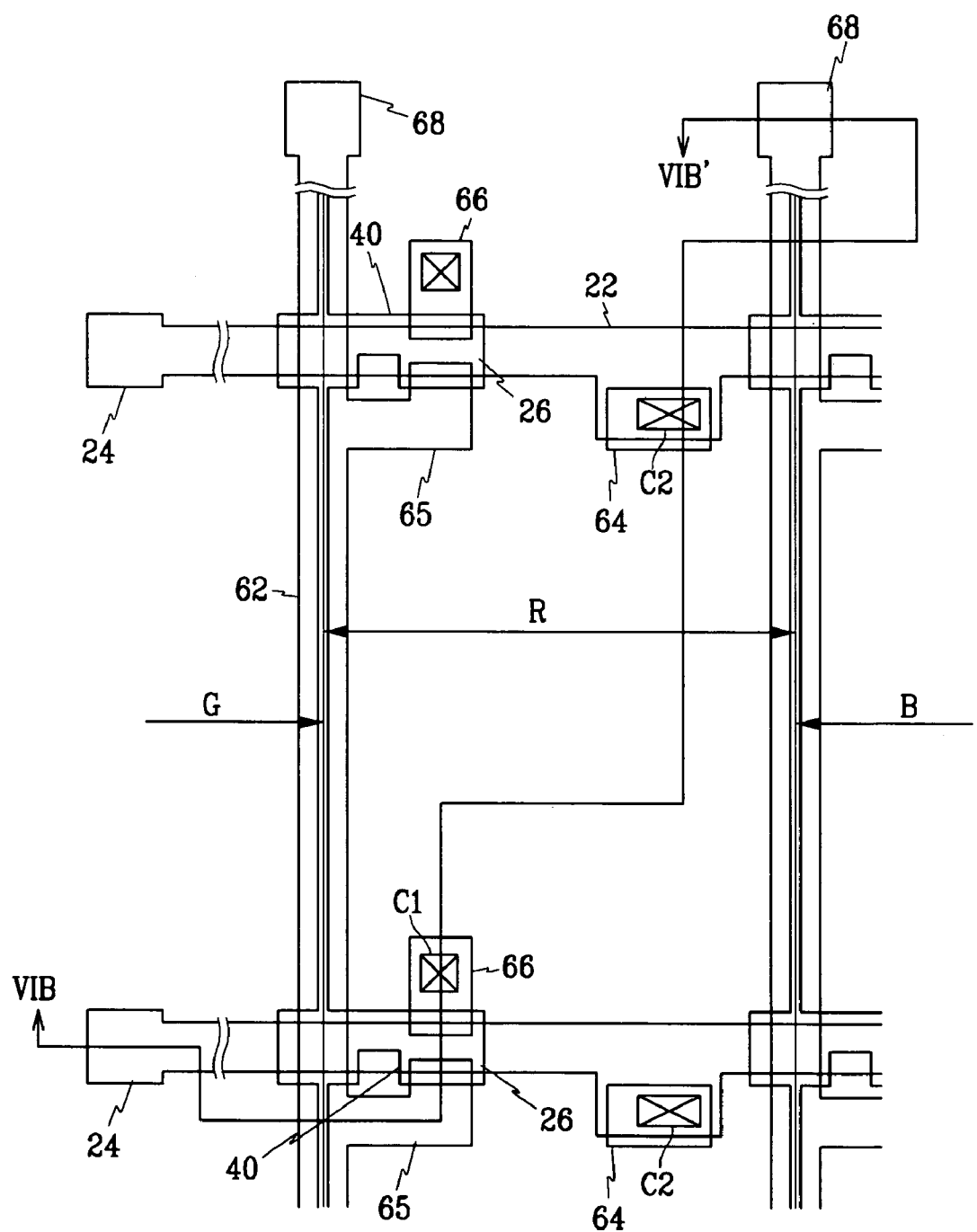
FIG. 6A is a layout view of the TFT array panel in a fourth step of the manufacturing method according to the first embodiment of the present invention.
Figure 6B:
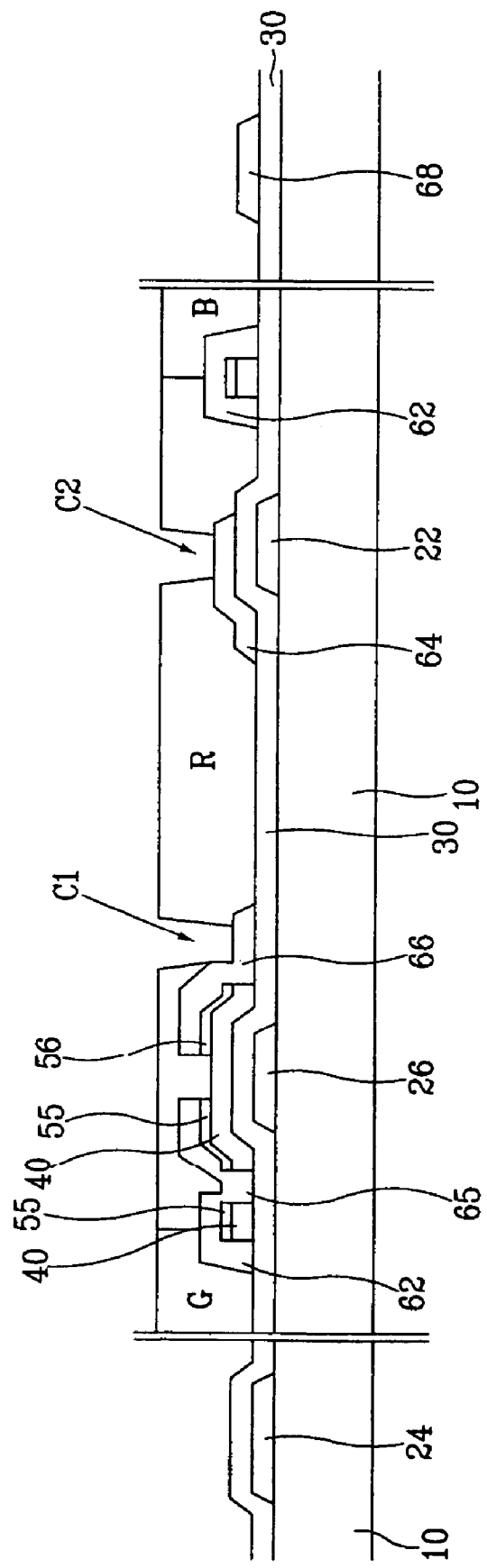
FIG. 6B is a sectional view taken along the line VIb-VIb' in FIG. 6A.

After forming an interlayer insulating layer (not shown), as shown in FIGS. 6A and 6B, photosensitive organic materials including red, green and blue pigments are sequentially coated to form a plurality of color filters R, G and B having a plurality of contact holes C1 and C2 by photolithography.

Figure 7A:
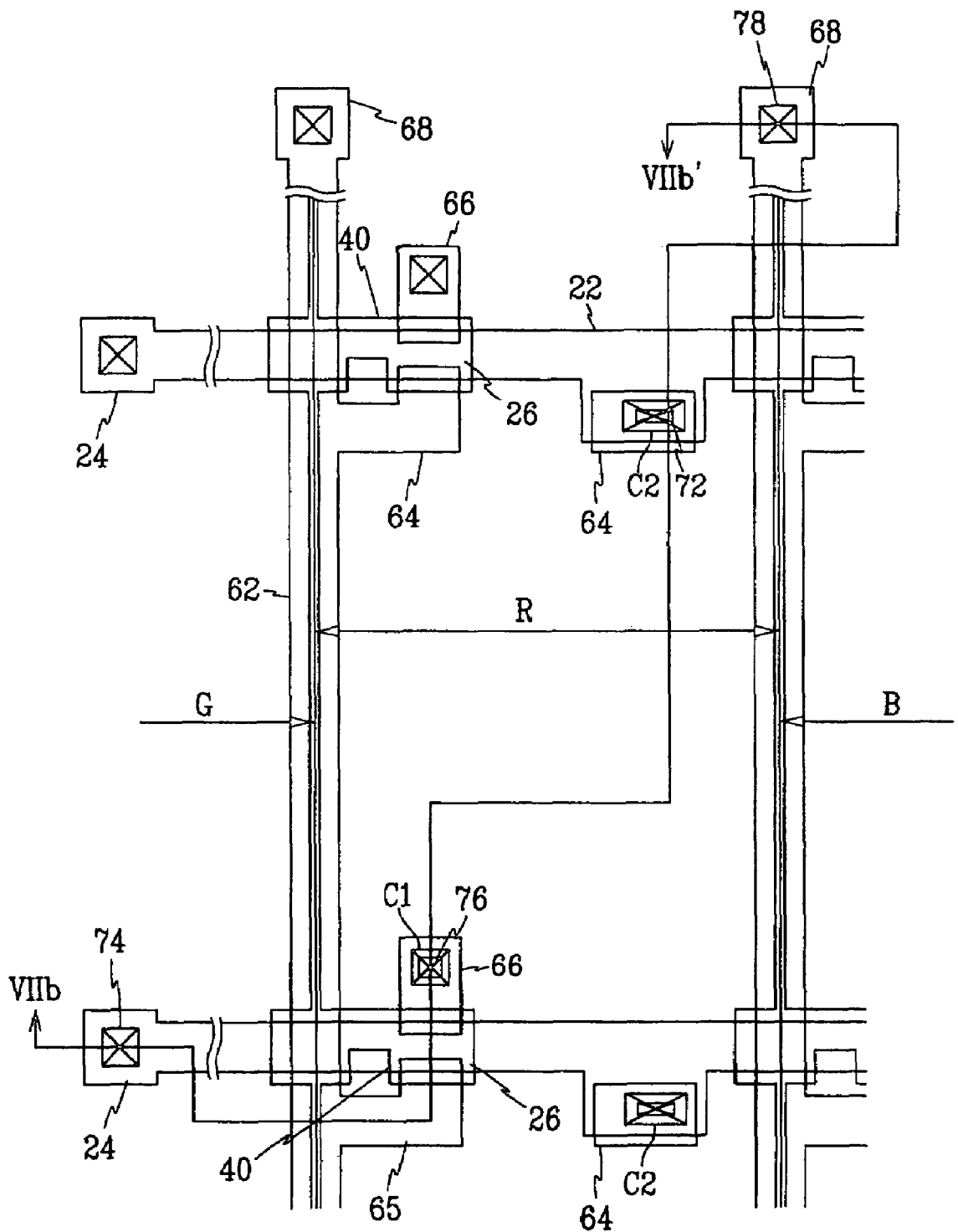
FIG. 7A is a layout view of the TFT array panel in a fifth step of the manufacturing method according to the first embodiment of the present invention.
Figure 7B:
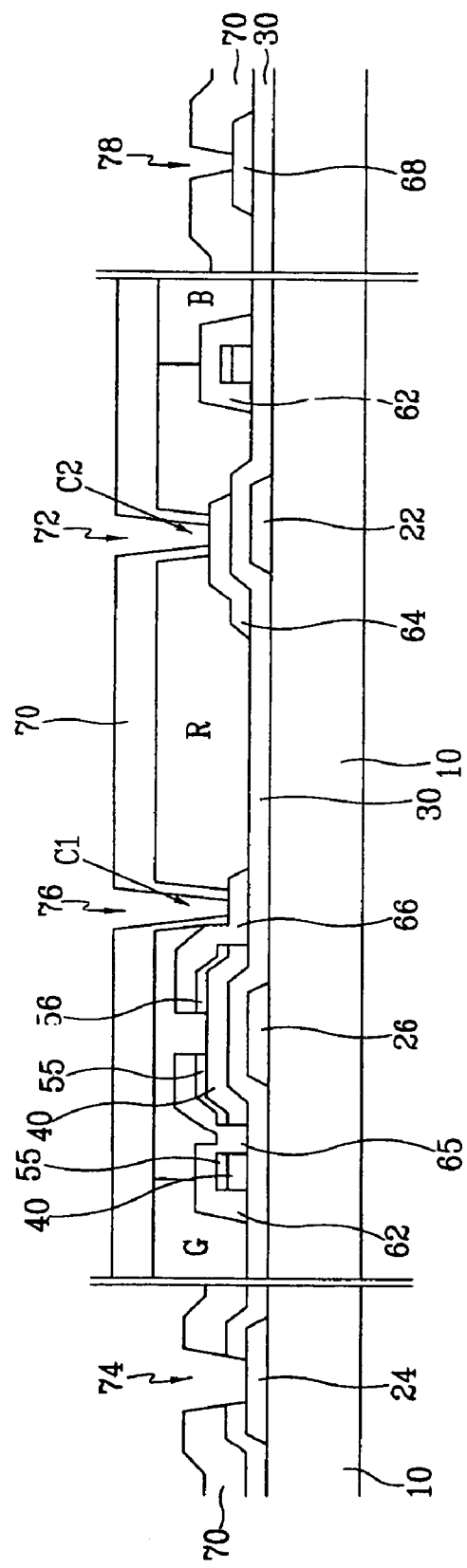
FIG. 7B is a sectional view taken along the line VIIb-VIIb' in FIG. 7A.

Next, as shown in FIGS. 7A and 7B, a passivation layer 70 is deposited and patterned along with the gate insulating layer 30 to form a plurality of contact holes 72, 74, 76 and 78. The contact holes 76 and 74 exposing the drain electrodes 66 and the storage-capacitor conductors 64, respectively, are located within the apertures C1 and C2 provided at the color filters R, G and B.

As described above, by providing the apertures C1 and C2 on the color filters R, G and B in advance and then patterning the passivation layer 70 to form the contact holes 76 and 74 exposing the drain electrodes 66 and the storage-capacitor conductors 64, respectively, it is possible to obtain a good profile of the contact holes 76 and 72.

In addition, since the larger size of the contact holes 76 and 72 compared with the apertures C1 and C2 makes the sidewalls of the contact holes 76 and 72 and the apertures C1 and C2 have step-wise shapes, the smooth profiles of other films to be formed later is obtained.

Finally, as shown in FIGS. 1 and 2, a plurality of pixel electrodes 82 and a plurality of contact assistants 84 and 88 are formed on passivation layer 70 by photo etch.

Figure 8:
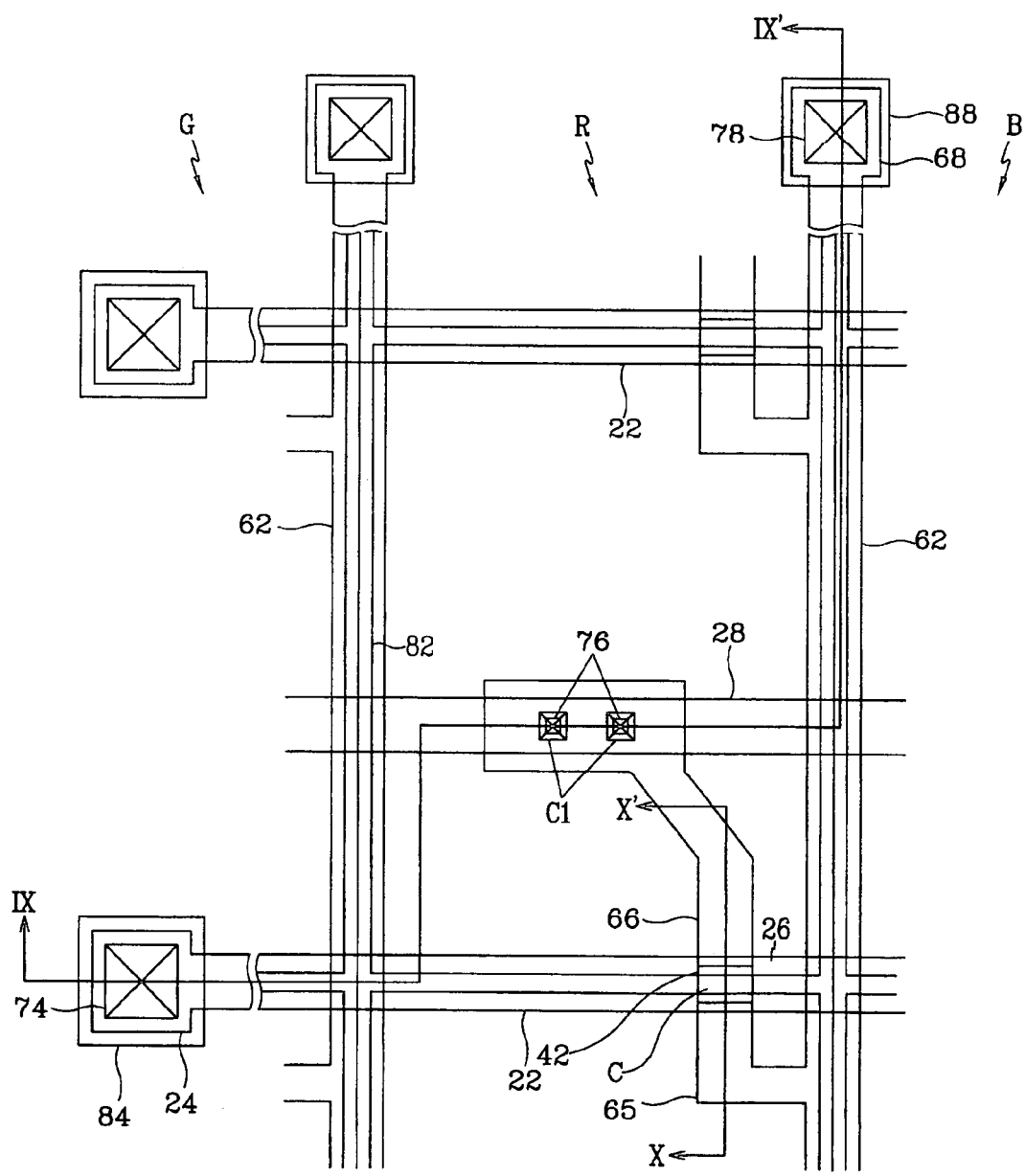
FIG. 8 is a layout view of a TFT array panel for an LCD according to a second embodiment of the present invention.
Figure 9:
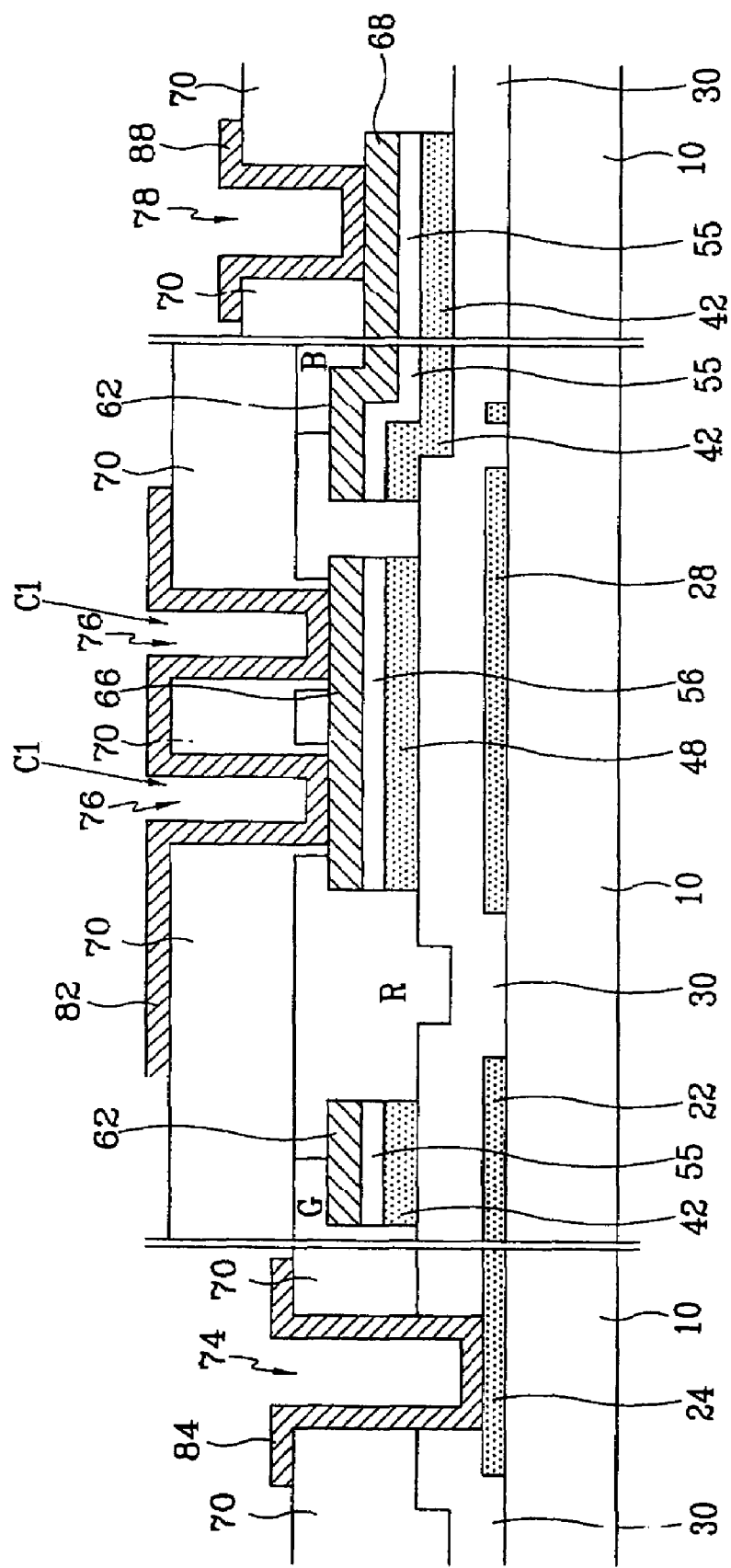
FIGS. 9 and 10 are sectional views of the TFT array panel taken along the lines IX-IX' and X-X' in FIG. 8, respectively.
Figure 10:
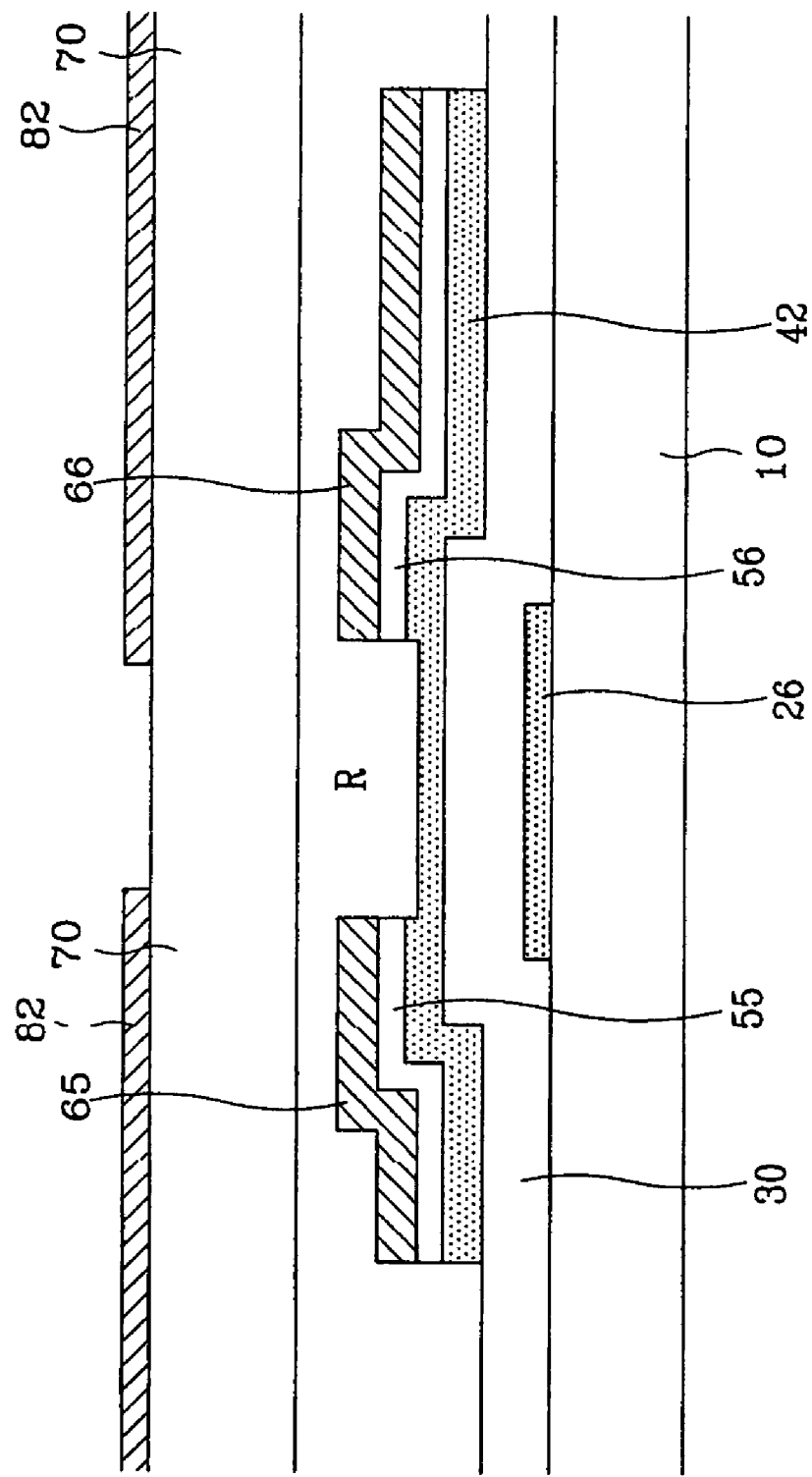

Referring to FIGS. 8 to 10, a TFT array panel for an LCD according to a second embodiment of the present invention will be described in detail.

FIG. 8 is a layout view of a TFT array panel for an LCD according to the second embodiment of the present invention, and FIGS. 9 and 10 are sectional views of the TFT array panels shown in FIG. 8 taken along the lines IX-IX' and X-X'.

As shown in FIGS. 8-10, a TFT array panel according the second embodiment of the present invention includes a plurality of storage electrode lines, one of which is shown in FIG. 8 and indicated by reference character 28, formed on an insulating substrate 10 instead of expansions of a plurality of gate lines 22. The storage electrode lines 28 include the same layer as the gate lines 22, extend substantially parallel to the gate lines 22 and are electrically separated from the gate lines 22. The storage electrode lines 28 are supplied with a predetermined voltage such as a common voltage, and overlap a plurality of drain electrodes 66, which are connected to a plurality of pixel electrodes 82, via the gate insulating layer 30 to form storage capacitors. The storage electrode lines 28 may be omitted if the storage capacitance due to the overlapping of the gate lines 22 and the pixel electrodes 82 are sufficient.

A plurality of semiconductor stripes and islands 42 and 48, respectively, and a plurality of ohmic contacts 55, 56 and 58 are provided.

The semiconductor stripes 42 have almost the same planar shapes as a plurality of data lines 62 and a plurality of drain electrodes 66 except for channel areas C of TFTs. That is, although the data lines 62 are disconnected from the drain electrodes 66 on the channel areas C, the semiconductor stripes 42 are continuous on the channel areas C to form channels of the TFTs. The semiconductor islands 48 have substantially the same planar shapes as the storage conductors 64. The ohmic contacts 55, 56 and 58 have substantially the same planar shapes as the data lines 62, the drain electrodes 66 and the storage conductors 64 thereover.

Now, a method of manufacturing the TFT array panel for an LCD according to the second embodiment of the present invention will be described in detail with reference to FIGS. 11A to 18C and FIGS. 8 to 10.

FIGS. 11A, 13A, 17A and 18A are layout views of a TFT array panel for a transmissive type LCD in the respective steps of a manufacturing method thereof according to the second embodiment of the present invention. FIGS. 11B and 12A and FIGS. 11C and 12B are sectional views of the TFT array panel shown in FIG. 11A taken along the lines XIB-XIB' and XIC-XIC', respectively, and sequentially illustrate a manufacturing method thereof according to the second embodiment of the present invention. FIGS. 13B, 14A, 15A and 16A and FIGS. 13C, 14B, 15B and 16B are sectional views of the TFT array panel shown in FIG. 13A taken along the lines XIIIb-XIIIb' and XIIIc-XIIIc', respectively, and sequentially illustrate a manufacturing method thereof according to the second embodiment of the present invention. FIGS. 17B and 17C are sectional views of the TFT array panel shown in FIG. 17A taken along the lines XVIIb-XVIIb' and XVIIc-XVIIc', respectively, and FIGS. 18B and 18C are sectional views of the TFT array panel shown in FIG. 18A taken along the lines ] XVIIIB-XVIIIB'] XVIIIb-XVIIIb' and XVIIIc-XVIIIc', respectively.

Figure 11A:
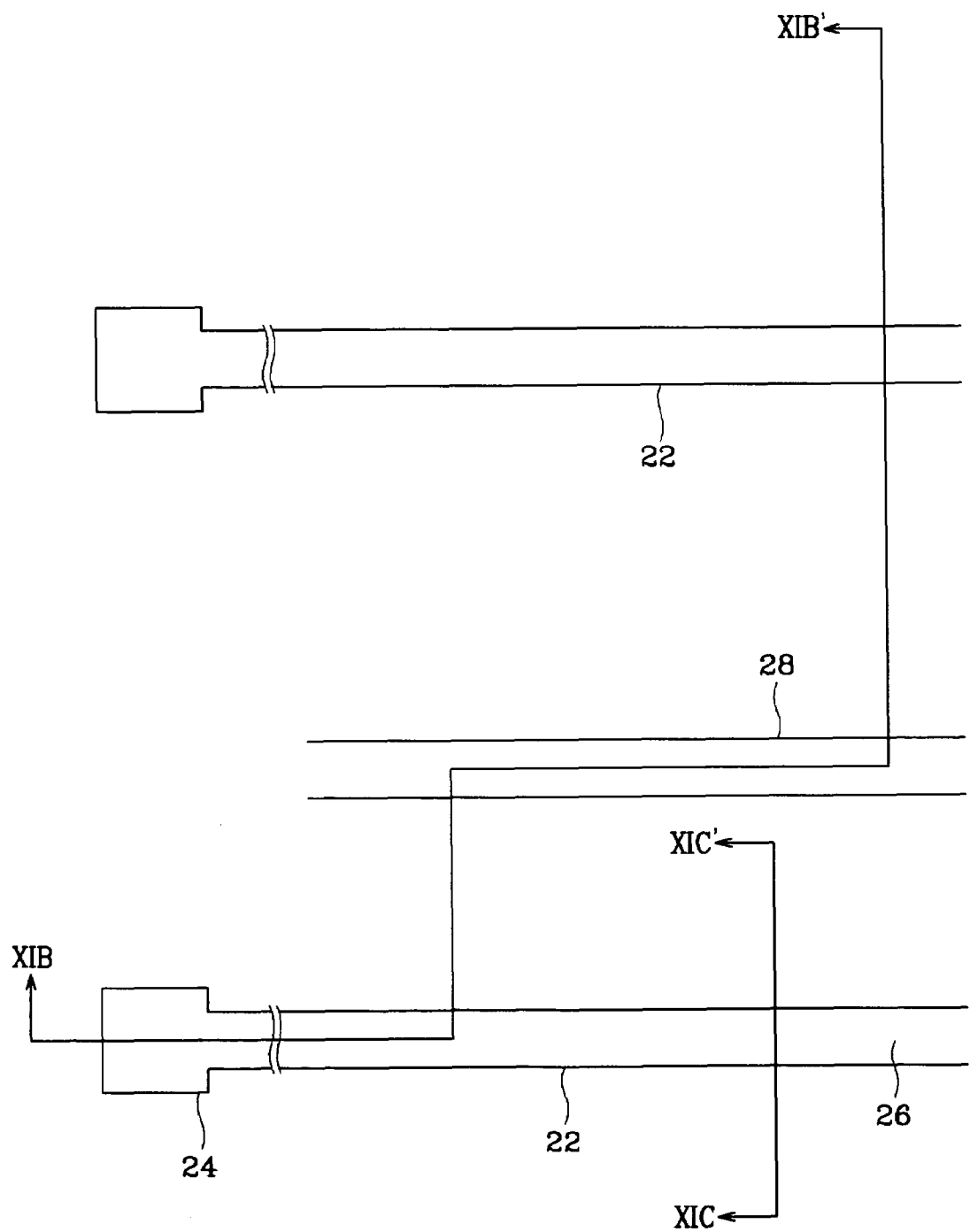
FIG. 11A is a layout view of the TFT array panel in a first step of the manufacturing method according to the second embodiment of the present invention.

First, as shown in FIGS. 11A to 11C, a conductive layer with 1,000-3,0000□ thickness is deposited on a substrate 10 and patterned by photolithography and etch to form a plurality of gate lines 22 and a plurality of storage electrode lines 28.

Figure 12A:
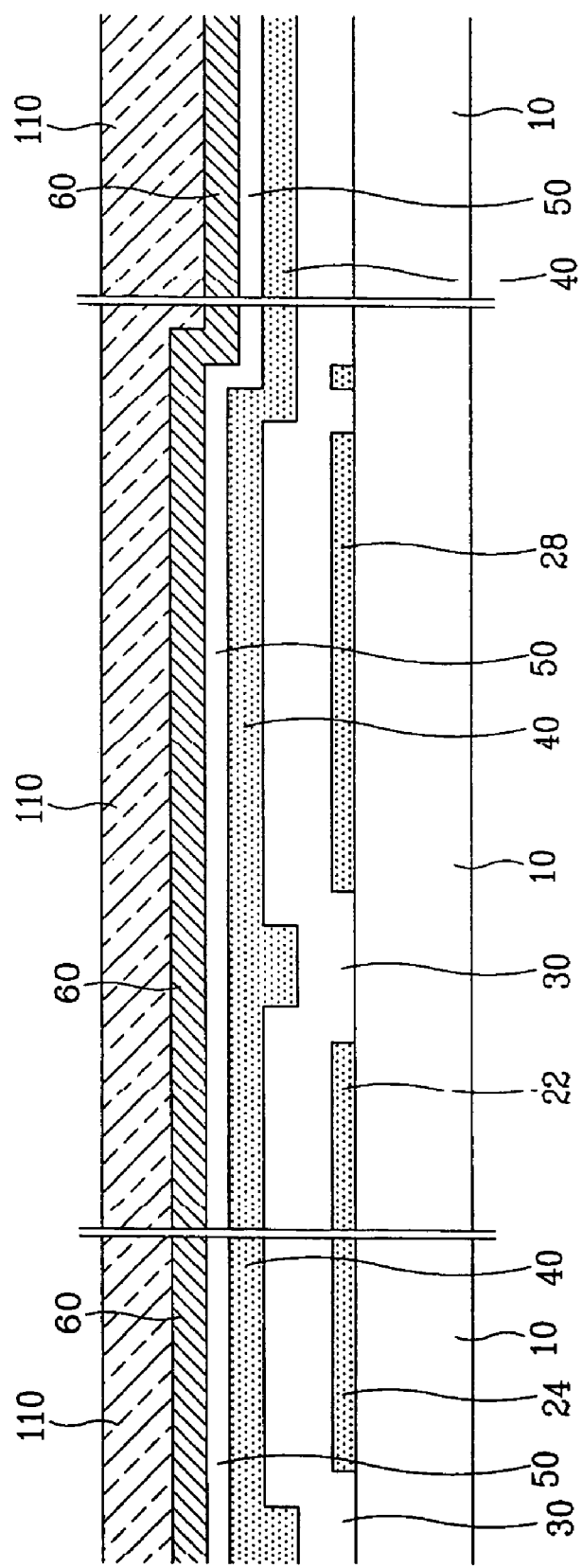
FIGS. 12A and 12B are sectional views taken along the lines XIB-XIB' and XIC-XIC' in FIG. 11A, respectively, which show the next step of FIGS. 11B and 11C, respectively.
Figure 12B:
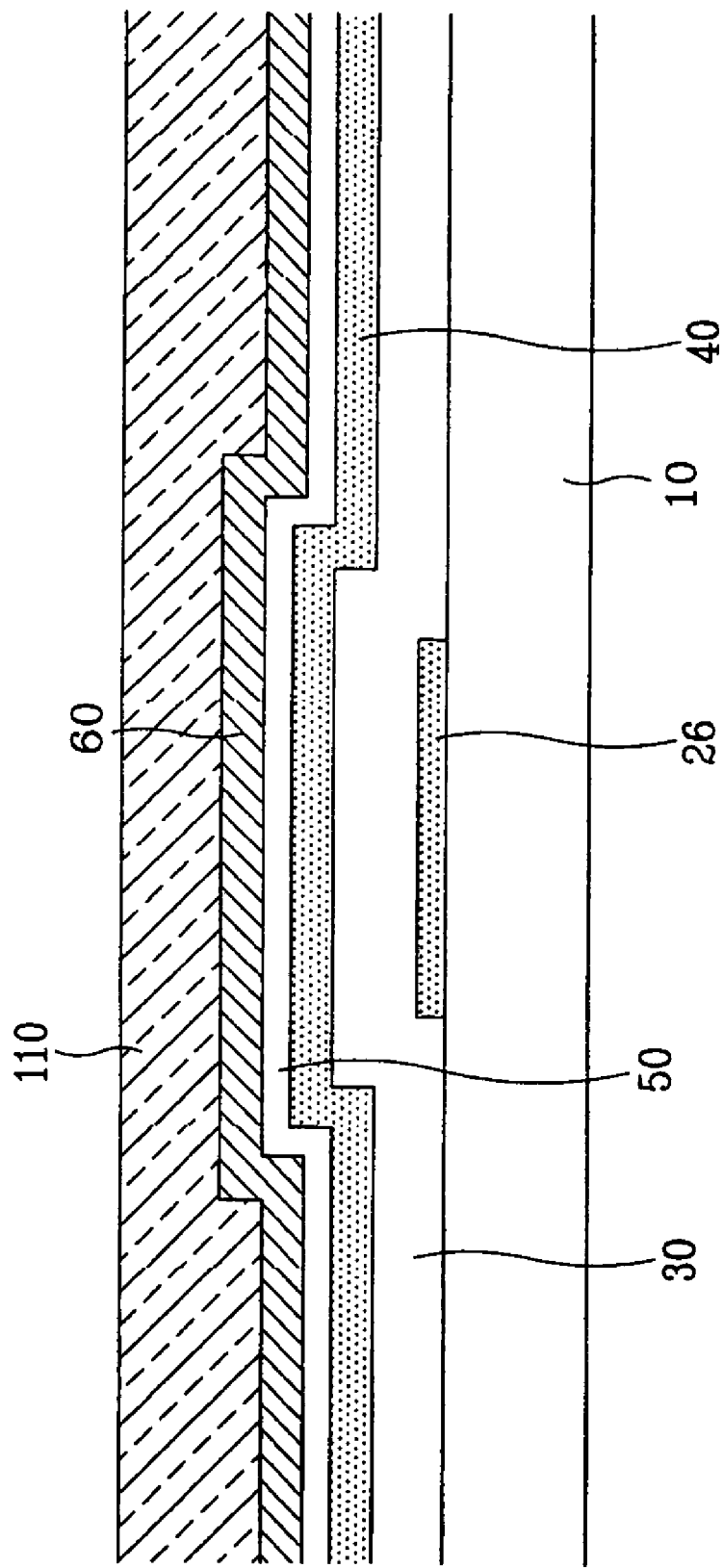

Next, as shown in FIGS. 12A and 12B, a gate insulating layer 30, a semiconductor layer 40, and a doped amorphous silicon layer 50 are sequentially deposited by CVD such that the layers 30, 40 and 50 bear thickness of about 1,500-5,000 Å, about 500-2,000 Å and about 300-600 Å, respectively. A conductive layer 60 with the thickness of about 1,500-3,000 Å is deposited by sputtering, and a photoresist film 110 with the thickness of about 1-2 microns is coated on the conductive layer 60.

Figure 13A:
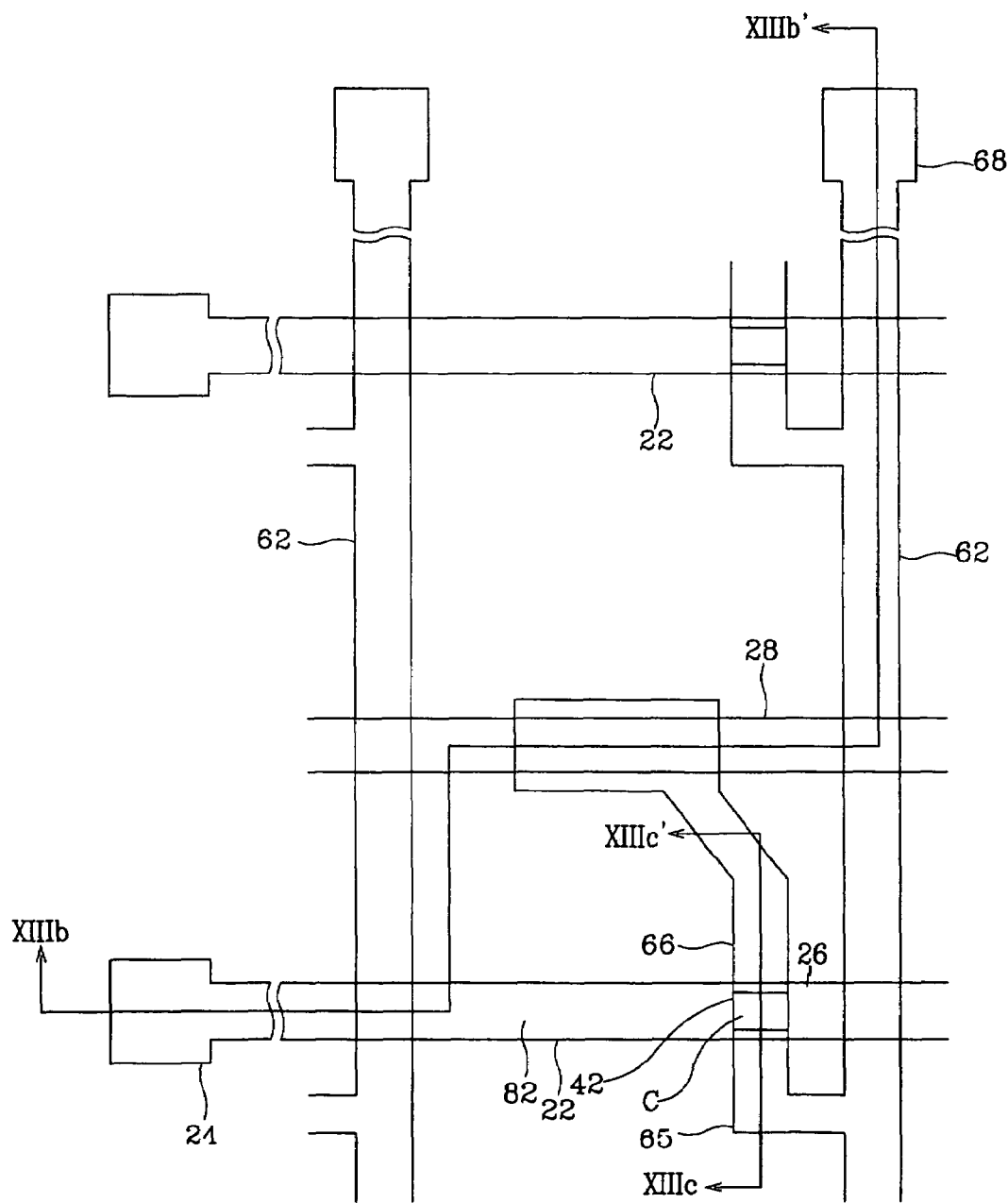
FIG. 13A is a layout view of the TFT array panel in the next step of the FIGS. 12A and 12B.
Figure 13B:
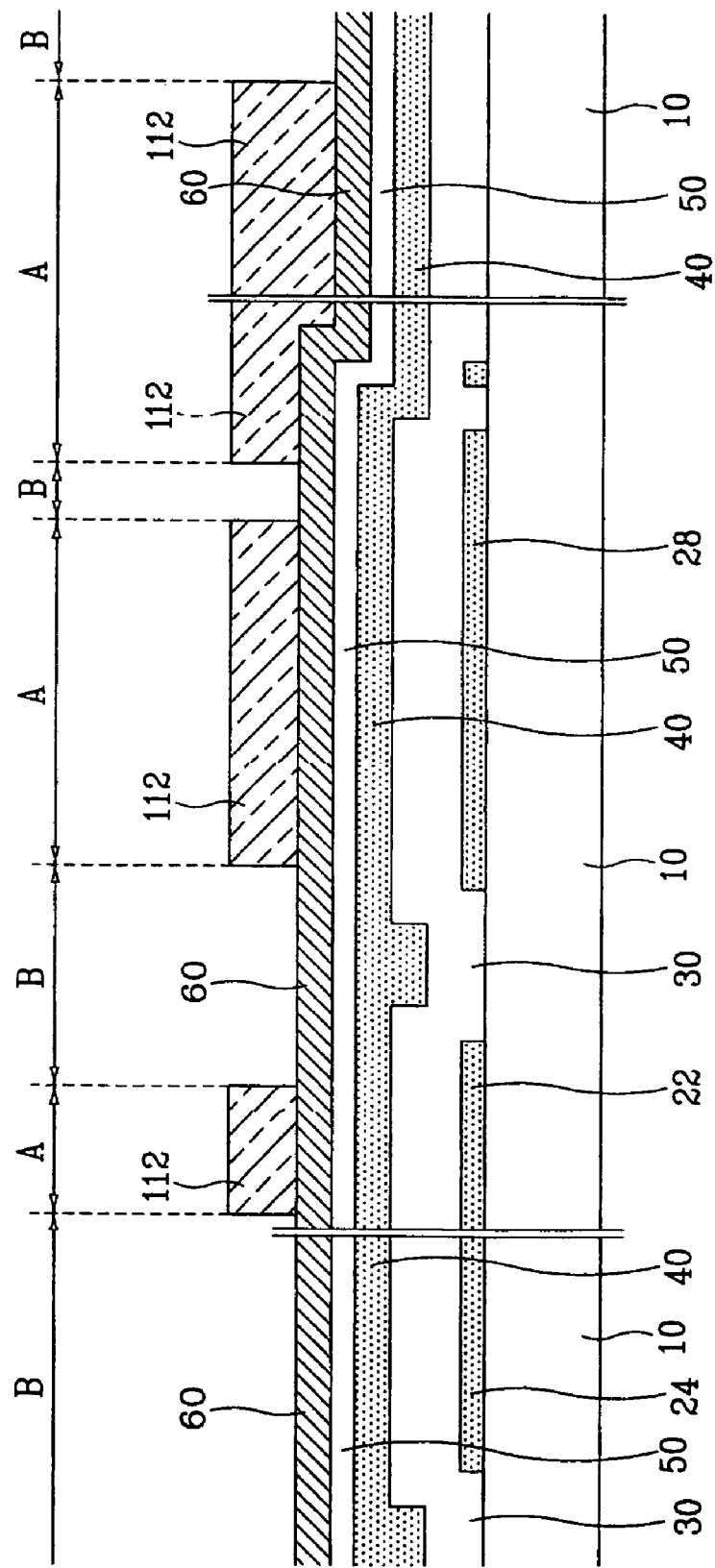
FIGS. 13B and 13C are sectional views taken along the lines XIIIb-XIIIb' and XIIIc-XIIIc' in FIG. 13A, respectively.
Figure 13C:
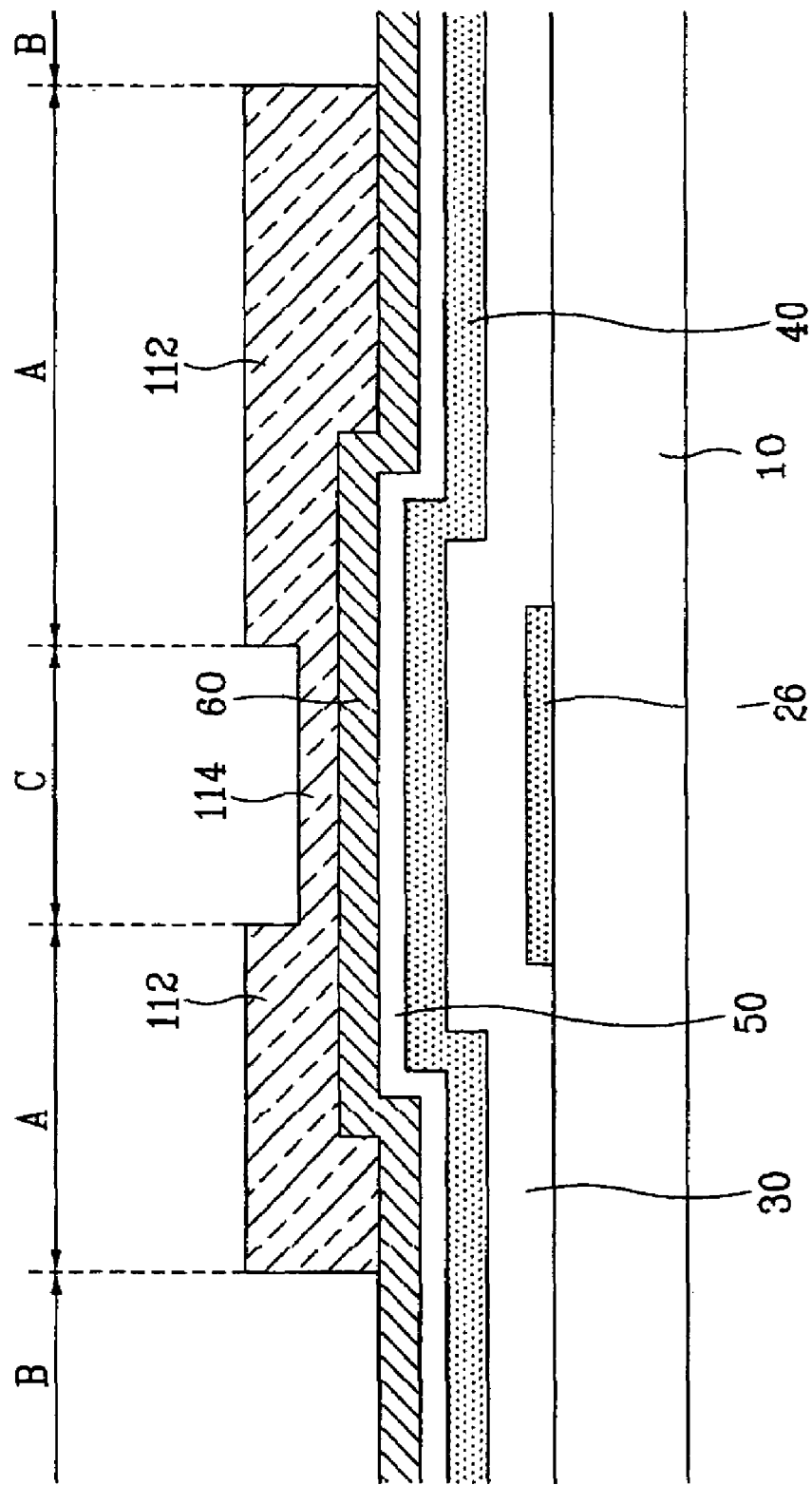

Subsequently, the photoresist film 110 is exposed to light through an exposure mask, and developed to form a photoresist pattern including a plurality of first and second portions 112 and 114, respectively, each having different thickness as shown in FIGS. 13B-13C. Each of the second portions 114, which is placed on a channel area C of a TFT, has a thickness less than the thickness of the first portions 112 which are above data areas A. The portions of the photoresist film 110 on the remaining areas B are removed or have a very small thickness. The thickness ratio of the second portions 114 on the channel areas C to the first portions 112 on the data areas A is adjusted depending upon the etching conditions in the subsequent etching steps. It is preferable that the thickness of the second portions 114 is equal to or less than half of the thickness of the first portions 112, in particular, equal to or less than 4,000 Å.

The position-dependent thickness of the photoresist film is obtained by several techniques, for example, by providing semi-transparent areas on the exposure mask as well as transparent areas and opaque areas. The semi-transparent areas alternatively have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography.

Another example is to use reflowable photoresist. That is, once a photoresist pattern made of a reflowable material is formed by using a normal exposure mask only with transparent areas and opaque areas, it is subject to reflow process to flow onto areas without the photoresist, thereby forming thin portions.

Figure 14A:
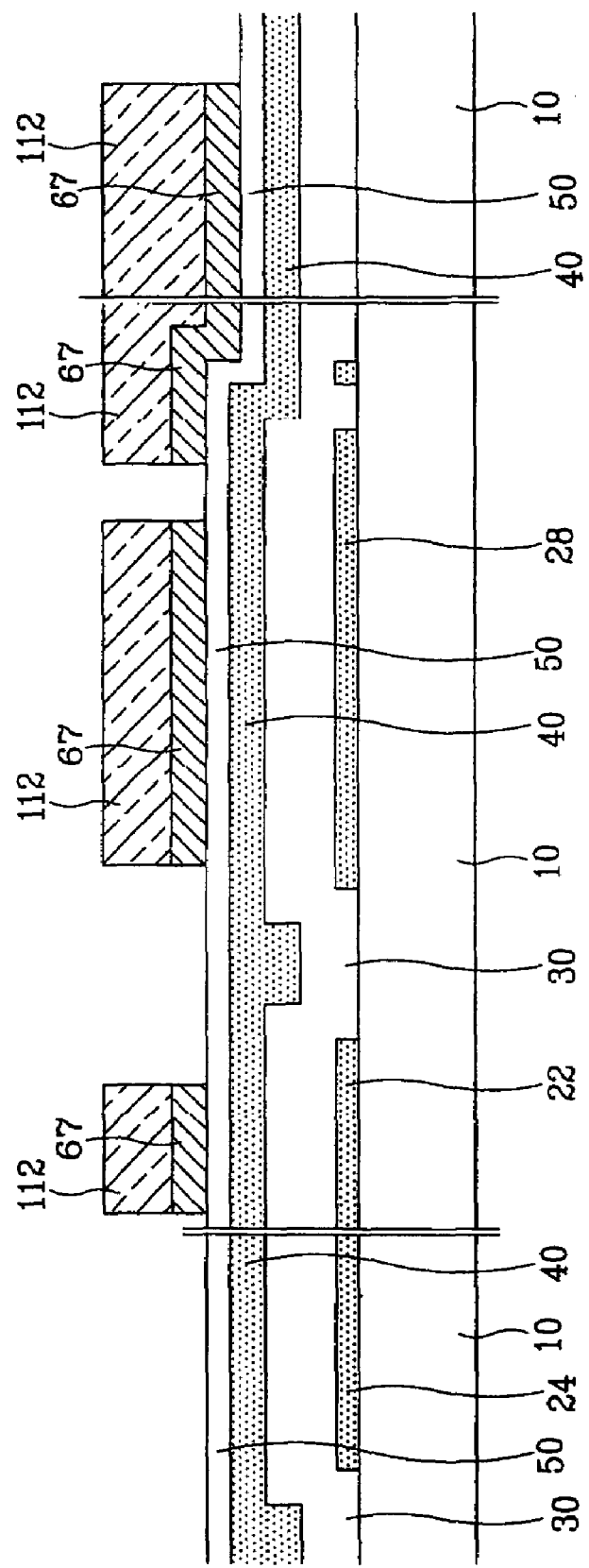
Figure 14B:
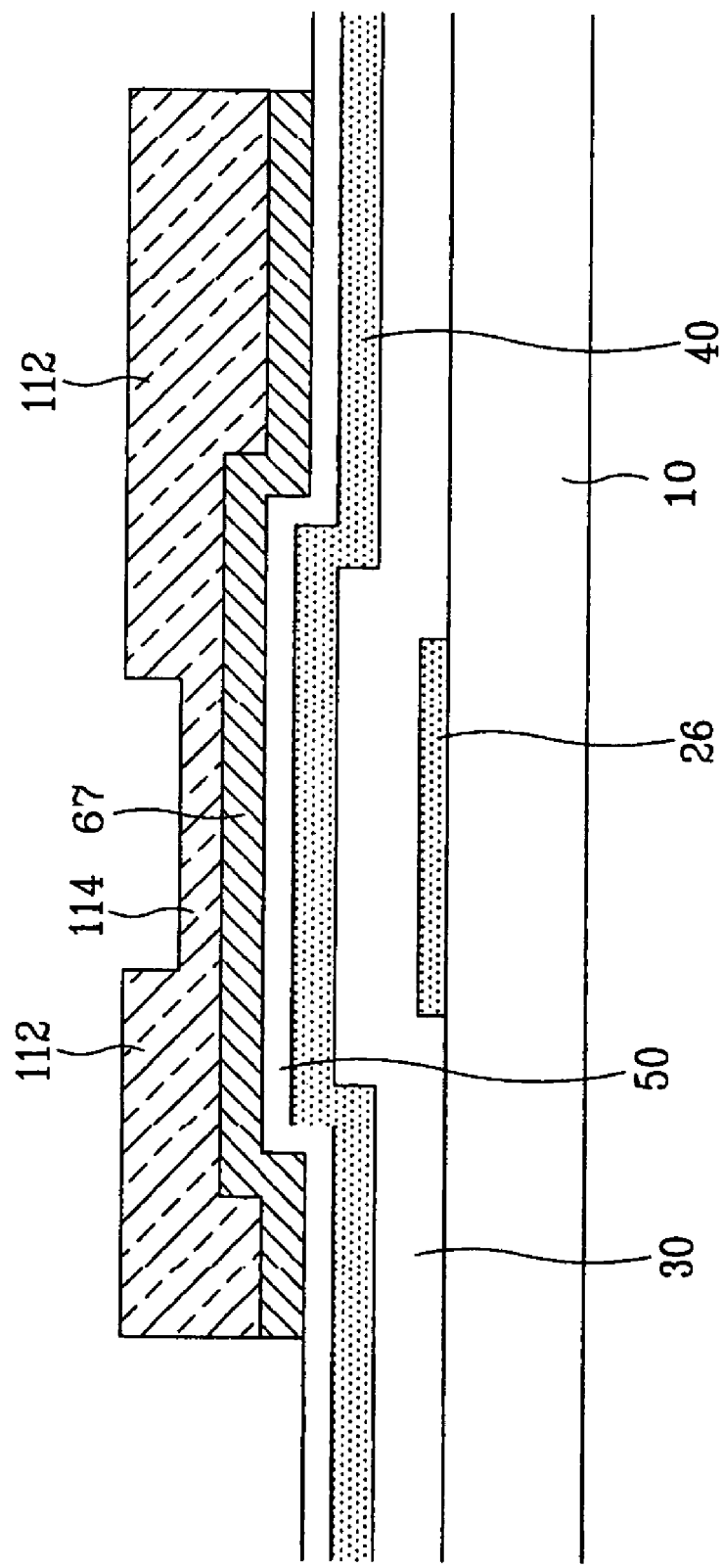

As shown in FIGS. 14A and 14B, the exposed portions of the conductive layer 60 on the areas B are removed to expose the underlying portions of the doped amorphous silicon layer 50. Both dry etch and wet etch are applicable to the conductive layer 60 containing Al or Al alloy. Wet etching, preferably with an etchant CeNHO$_3$, is preferred for Cr. When using dry etch, the two portions 112 and 114 of the photoresist pattern may be etched to have a reduced thickness. Reference numerals 64 and 67 indicate the remaining portions of the conductive layer 60, which will be referred to as "conductors." In particular, the reference numeral 64 is referred to as "storage conductors."

Figure 15A:
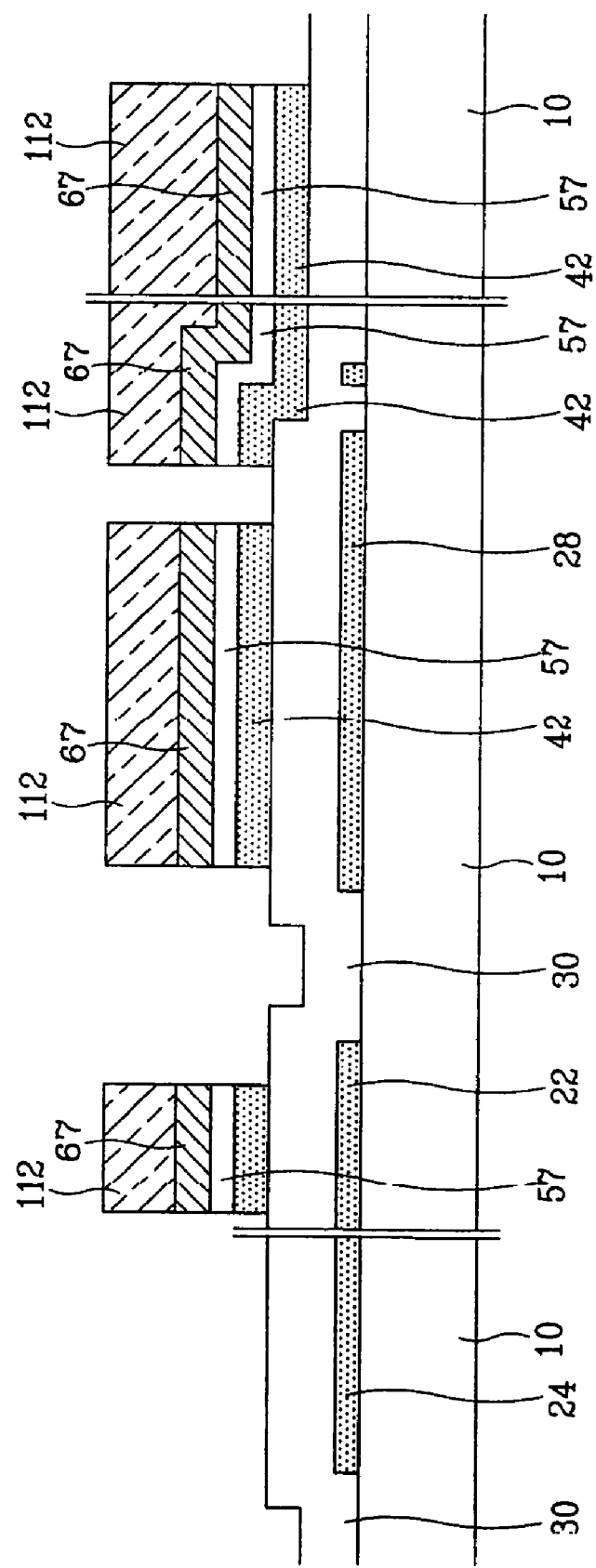

Referring to FIGS. 15A and 15B, the exposed portions of the doped amorphous silicon layer 50 on the areas B and the underlying portions of the semiconductor layer 40 are removed preferably by dry etch to expose the underlying conductors 67. The second portions 114 of the photoresist pattern are removed either simultaneously with or independent from the removal of the doped amorphous silicon layer 50 and the semiconductor layer 40. Residue of the second portions 114 remaining on the channel area C is removed by ashing. Reference numerals 42 and 48 indicate the remaining portions of the semiconductor layer 40, which will be respectively referred to as "semiconductor stripes" and "semiconductor islands" based on their planar shapes. Reference numerals 57 and 58 indicate the remaining portions of the doped amorphous silicon layer 50, which will be respectively referred to as "doped amorphous silicon stripes" and "doped amorphous silicon islands" based on their planar shapes.

Figure 16A:
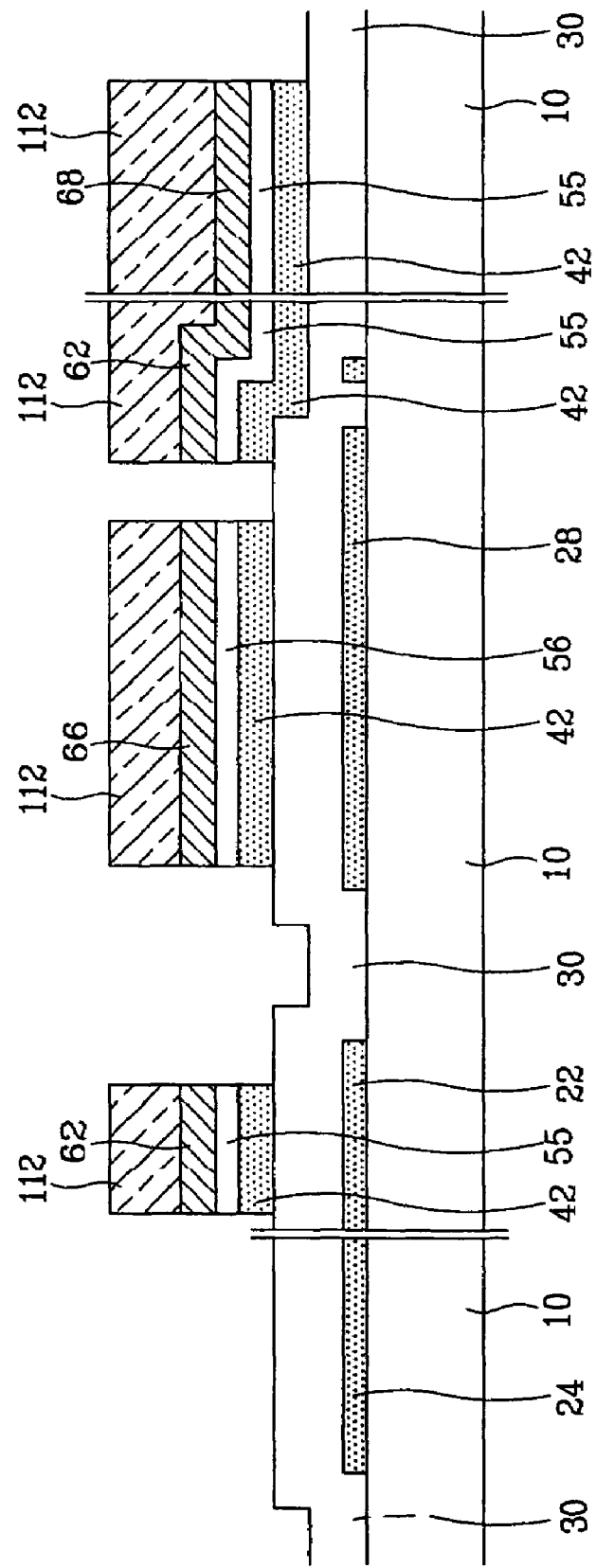
Figure 16B:
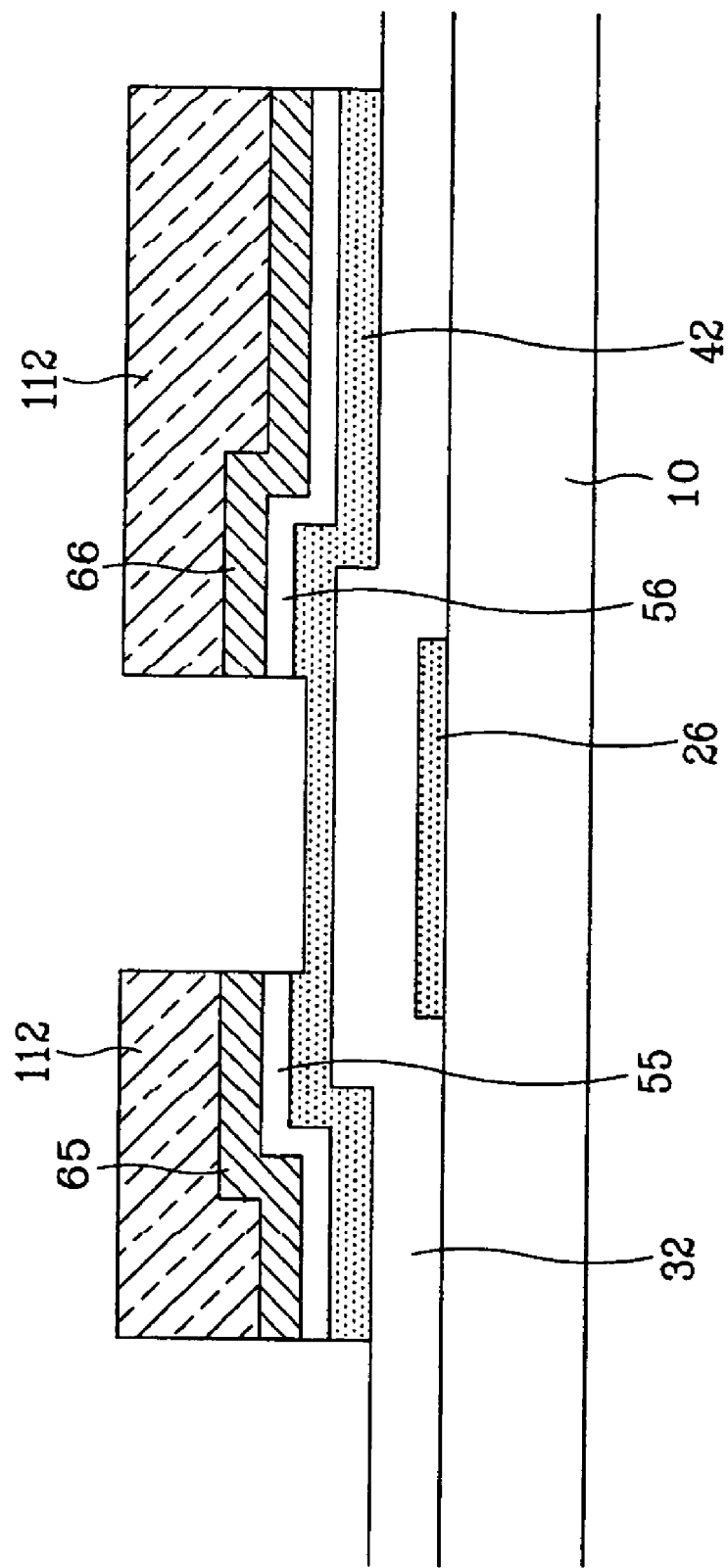

Subsequently, as shown in FIGS. 16A and 16B, the exposed portions of the conductors 67 on the channel areas C and the underlying portions of the doped amorphous silicon stripes 57 are removed. As shown in FIG. 16B, top portions of the semiconductor stripes 42 on the channel areas C may be removed to cause thickness reduction, and the first portion 112 of the photoresist pattern is etched to a predetermined thickness.

In this way, each conductor 67 on the channel area is divided into a data line 62 and a plurality of drain electrodes 66 to be completed, and also each doped amorphous silicon stripe 57 is divided into an ohmic contact stripe 55 and a plurality of ohmic contact islands 56 to be completed.

The first portions 112 remaining on the data areas A are removed either after the removal of the portions of the conductors 67 on the channel areas C or after the removal of the underlying portions of the doped amorphous silicon stripes 57.

Figure 17A:
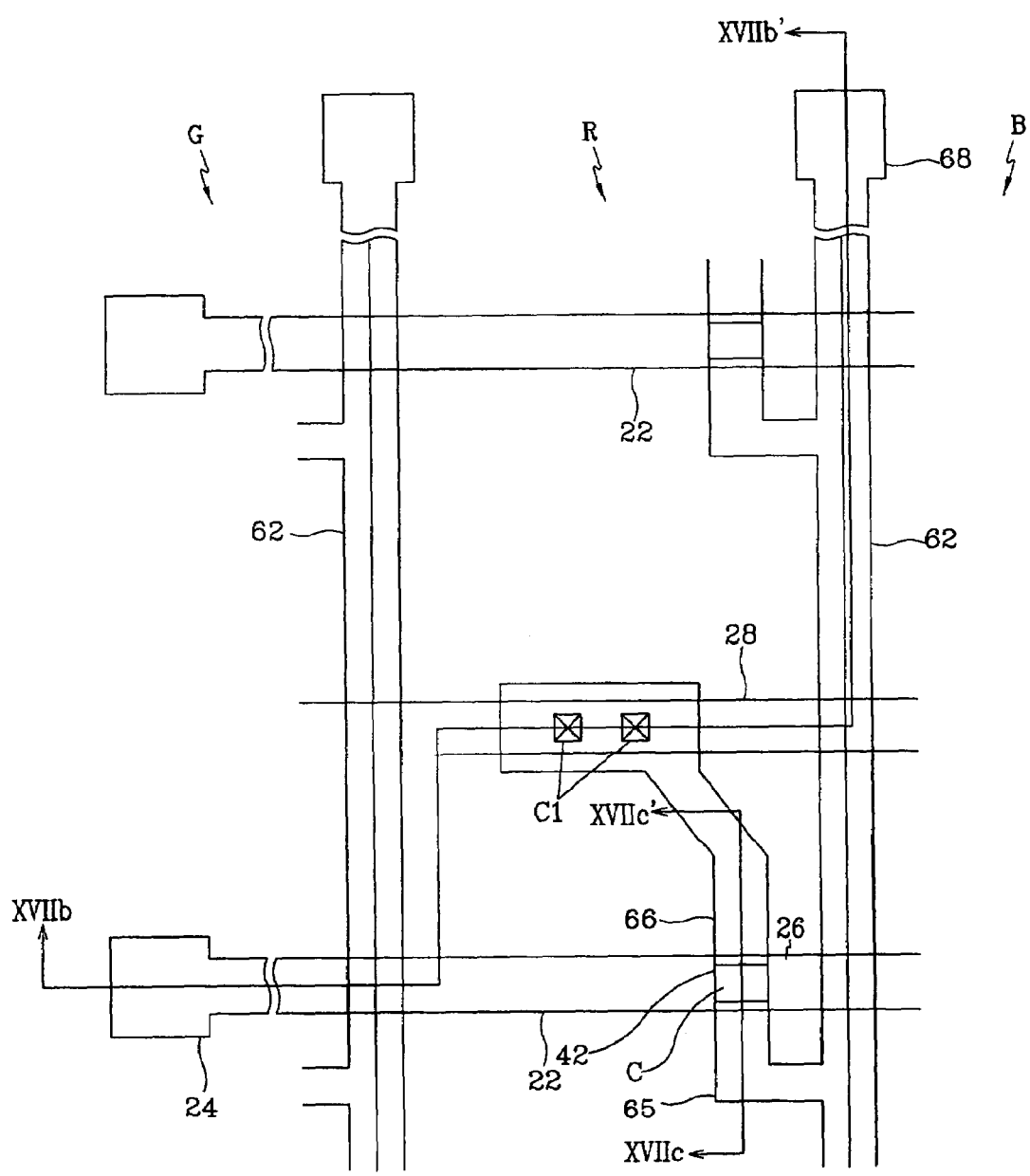
FIG. 17A is a layout view of the TFT array panel after completion of the steps of FIGS. 16A and 16B.
Figure 17B:
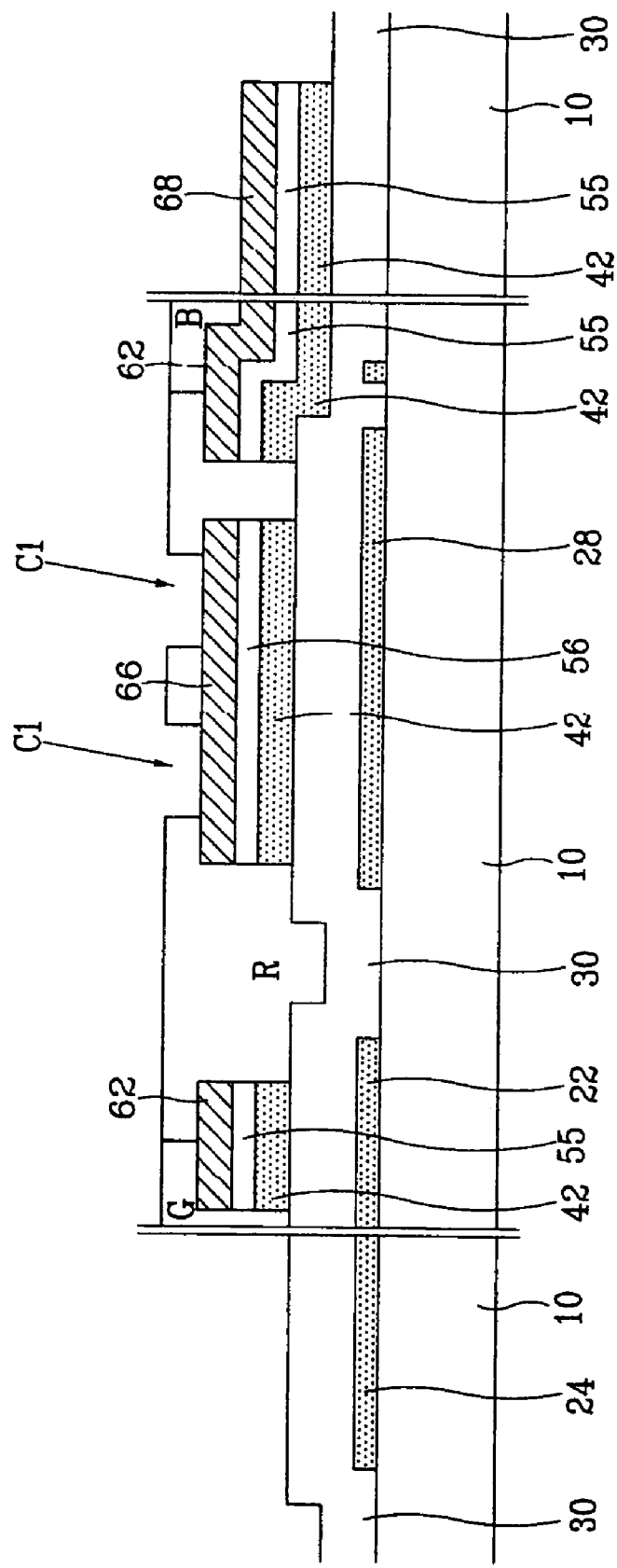
FIGS. 17B and 17C are sectional views of the TFT array panel shown in FIG. 17A taken along the lines XVIIb-XVIIb' and XVIIc-XVIIc', respectively.
Figure 17C:
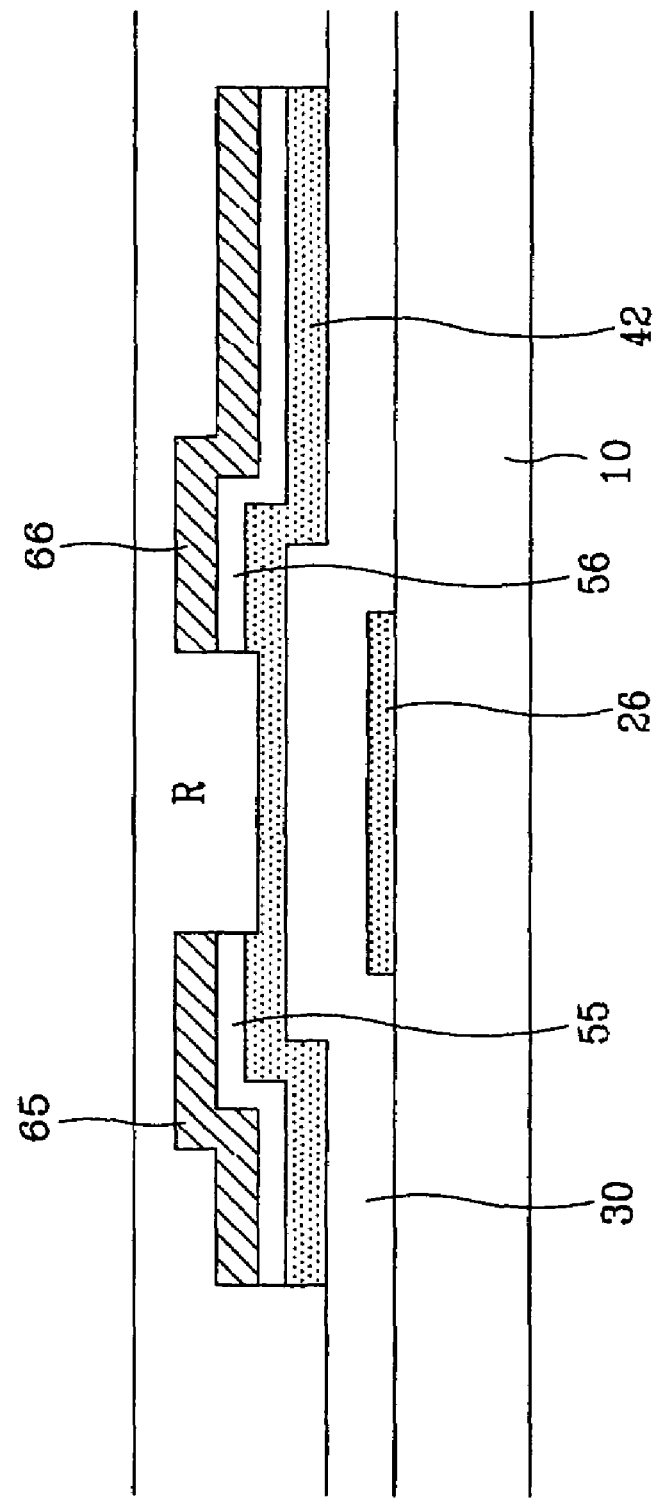
Figure 18A:
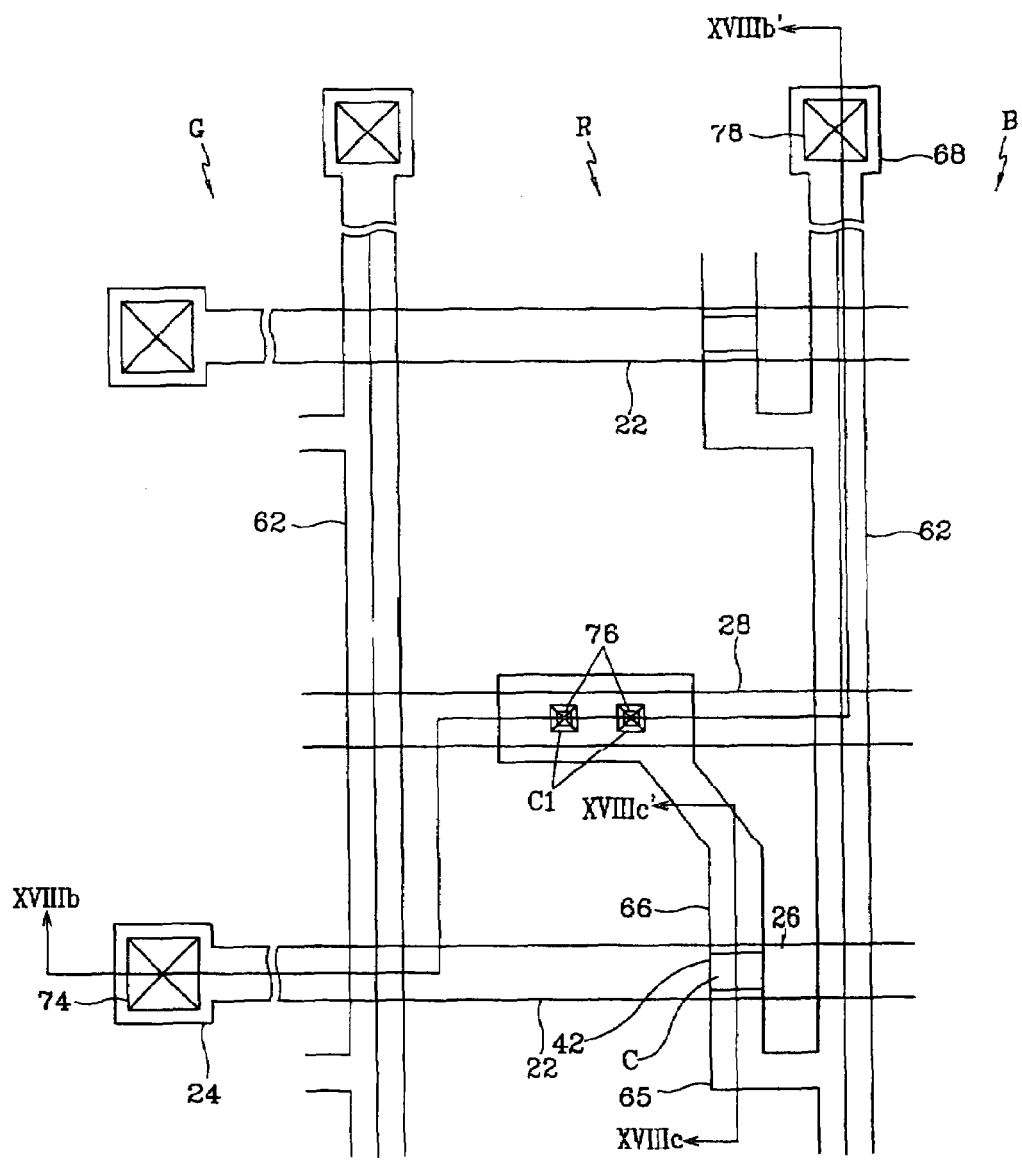
FIG. 18A is a layout view of the TFT array panel after completion of the steps of FIGS. 17A to 17C.
Figure 18B:
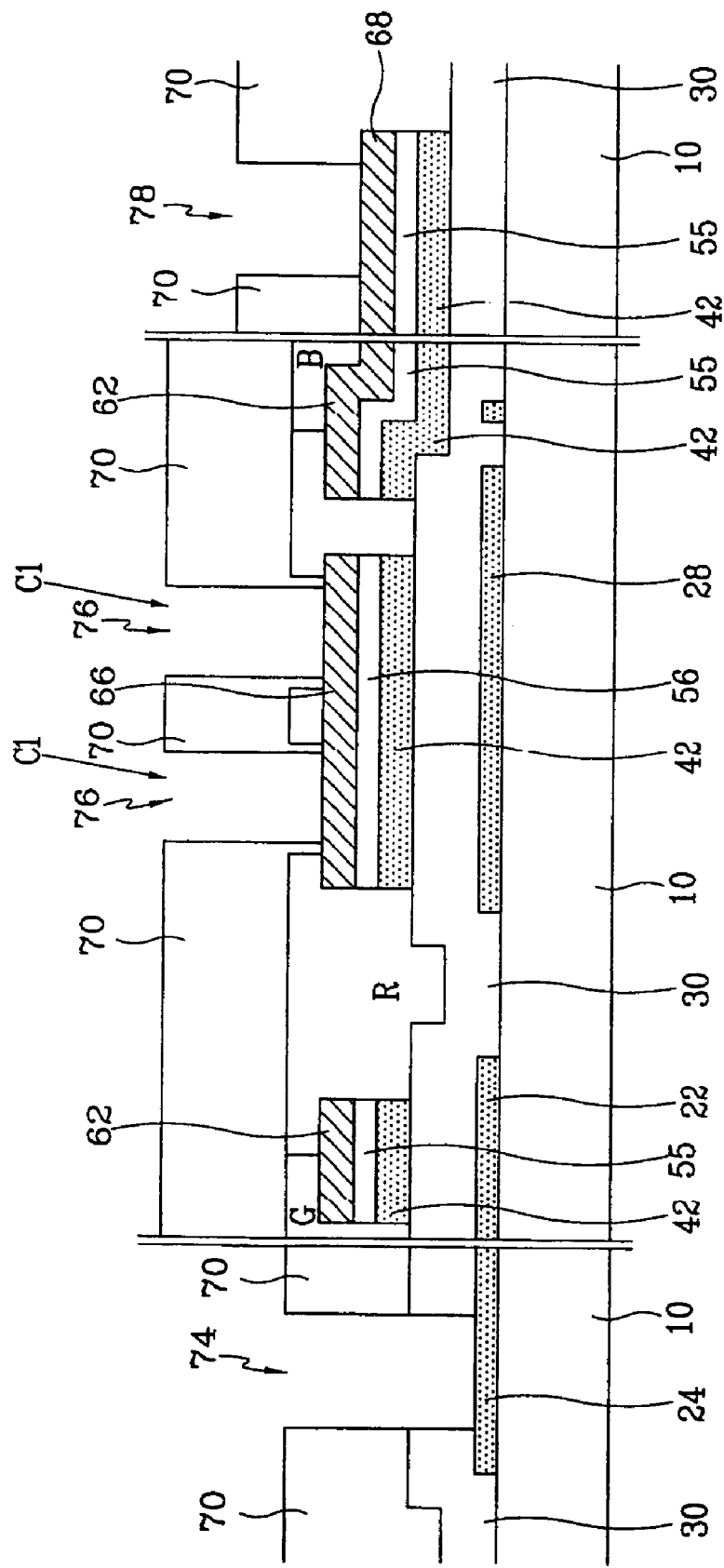
FIGS. 18B and 18C are sectional views taken along the lines XVIIIb-XVIIIb' and XVIIIc-XVIIIc', respectively, in FIG. 18A.
Figure 18C:
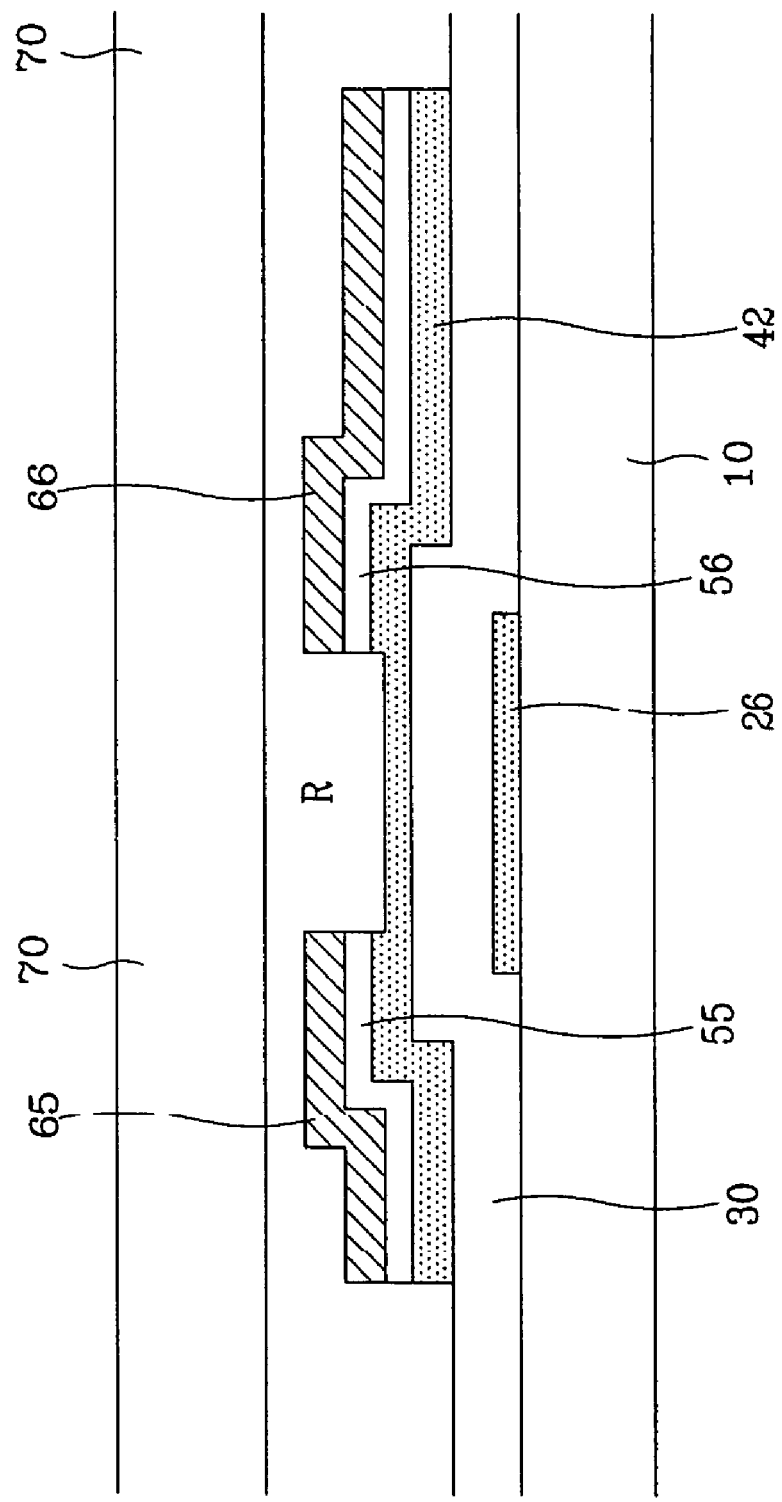

After the data line 62, 64, 65, 66 and 68, the ohmic contact layer pattern 55, 56 and 58 and the semiconductor pattern 42 and 48 are formed in such a way, photoresist layers respectively including red, green and blue pigments are coated, and patterned by photolithography with exposure and development to form the color filters R, G and B in sequence, as shown in FIGS. 17A to 17C.

A light blocking film made of red or green color filter may be formed on the channel portions C of the TFT. The light blocking film helps block or absorb visible rays with short wavelength incident on the channel portions C of the TFT.

Subsequently, a passivation layer 70 is formed on the color filters R, G and B is deposited by a chemical vapor deposition. The passivation layer 70 is patterned together with the gate insulating layer 30 by a photo etching process using a mask to form a plurality of contact holes 72, 74, 78 and 76 exposing the drain electrodes 66, the gate pads 24, the data pads 68 and the storage-capacitor conductors 64, respectively.

Finally, as shown in FIGS. 8 to 10, a plurality of pixel electrodes 82 and a plurality of contact assistants 84 and 88 with a thickness of about 400-500 Å are formed.

The TFT array panel may have various modifications and may be manufactured by various modified methods.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel for a display, comprising:
    forming a gate conductor including a gate line and a gate electrode on an insulating substrate;
    forming a gate insulating layer covering the gate conductor;
    forming a semiconductor pattern on the gate insulating layer;
    forming a data conductor at least on the semiconductor pattern, the data conductor including a source electrode, and a drain electrode separated from the source electrode;
    forming a color filter covering the data conductor using photoresist material including pigment, wherein the color filter includes a first aperture exposing at least a portion of the drain electrode;
    depositing a passivation layer on the color filter;
    patterning the passivation layer to form a first contact hole within the first aperture to expose at least a portion of the drain electrode; and
    forming a pixel electrode connected to the drain electrode via the first contact hole,
    wherein the first aperture is only formed on the drain electrode.

2. The method of claim 1, wherein the data conductor further includes a conductor pattern overlapping the gate line or a storage electrode line formed of the same layer as the gate line, to form the storage capacitor, the color filter has a second aperture exposing at least a portion of the conductor pattern, and the passivation layer has a second contact hole located within the second aperture and exposing at least a portion of the conductor pattern.

3. The method of claim 1, wherein the deposition of the passivation layer is performed by coating organic material or by chemical vapor depositing an insulating layer having dielectric constant equal to or less than 4.0.

4. The method of claim 1, further comprising forming an interlayer insulating layer of SiNx or SiOx under the color filter.

5. The method of claim 1, wherein the third portion has a thickness less than the first portion and the second portion.

* * * * *